(12) United States Patent
Watanabe et al.

(10) Patent No.: US 8,592,890 B2
(45) Date of Patent: Nov. 26, 2013

(54) SEMICONDUCTOR MEMORY DEVICE AND METHOD FOR MANUFACTURING SAME

(75) Inventors: Nobutaka Watanabe, Mie-ken (JP);
Kazuyuki Higashi, Kanagawa-ken (JP);
Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 326 days.

(21) Appl. No.: 13/004,229

(22) Filed: Jan. 11, 2011

(65) Prior Publication Data

US 2012/0061743 A1    Mar. 15, 2012

(30) Foreign Application Priority Data

Sep. 9, 2010    (JP) ................. 2010-202443

(51) Int. Cl.
*H01L 29/792* (2006.01)
*H01L 29/76* (2006.01)

(52) U.S. Cl.
USPC ..... 257/324; 257/314; 257/326; 257/E29.309

(58) Field of Classification Search
USPC ....... 257/E29.309, 314–316, 324–326, E29.3
See application file for complete search history.

(56) References Cited

U.S. PATENT DOCUMENTS

| 7,847,334 | B2 | 12/2010 | Katsumata et al. |
| 2007/0054485 | A1 | 3/2007 | Torres et al. |
| 2009/0267135 | A1 | 10/2009 | Tanaka et al. |
| 2010/0133599 | A1* | 6/2010 | Chae et al. ............. 257/315 |

FOREIGN PATENT DOCUMENTS

| JP | 2007-27734 | 2/2007 |
| JP | 2009-267243 | 11/2009 |
| KR | 10-2010-0063634 | 6/2010 |

OTHER PUBLICATIONS

U.S. Appl. No. 12/728,763, filed Mar. 22, 2010, Nobutaka Watanabe.
Notification of Comments issued Jun. 14, 2012 in Korean Patent Application No. 10-2011-18851 (with English translation).
U.S. Appl. No. 13/351,420, filed Jan. 17, 2012, Ko.
Office Action issued Dec. 19, 2012, in Japanese Patent Application No. 2010-202443 (with English-language translation).

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

According to one embodiment, a semiconductor memory device includes a stacked body, a contact, a semiconductor member, a charge storage layer, and a penetration member. The stacked body includes an electrode film stacked alternately with an insulating film. A configuration of an end portion of the stacked body is a stairstep configuration having a step provided every electrode film. The contact is connected to the electrode film from above the end portion. The semiconductor member is provided in a portion of the stacked body other than the end portion to pierce the stacked body in a stacking direction. The charge storage layer is provided between the electrode film and the semiconductor member. The penetration member pierces the end portion in the stacking direction. The penetration member does not include the same kind of material as the charge storage layer.

15 Claims, 25 Drawing Sheets

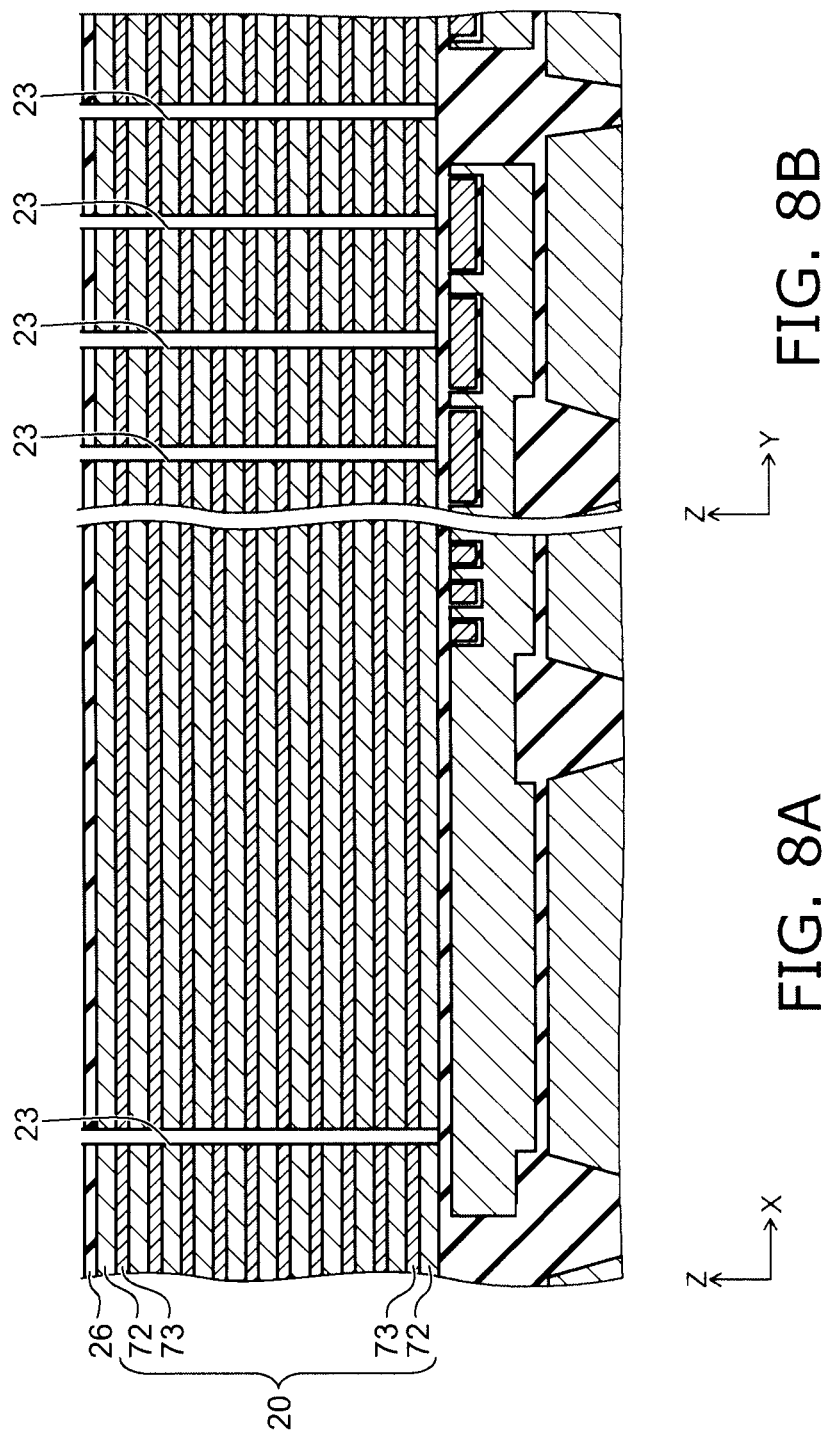

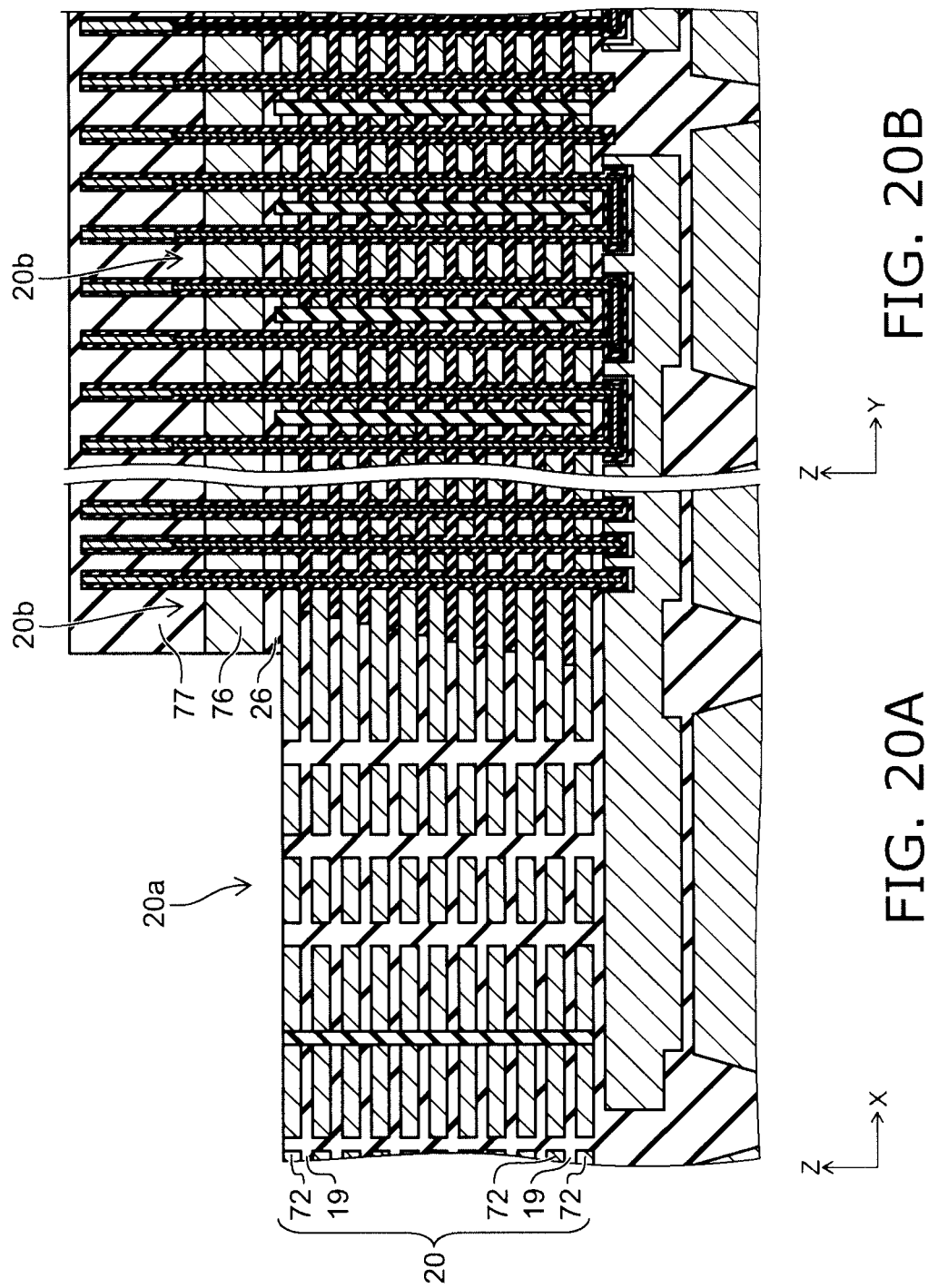

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-202443, filed on Sep. 9, 2010; the entire contents of which are incorporated herein by reference.

FIELD

Embodiments described herein relate generally to a semiconductor memory device and a method for manufacturing the same.

BACKGROUND

Semiconductor memory devices of flash memory and the like conventionally have been constructed by two-dimensionally integrating memory cells on a surface of a silicon substrate. Although it is necessary to increase the integration of the memory cells to reduce the cost per bit and increase the storage capacity of such a semiconductor memory device, increasing the integration in recent years has become difficult in regard to both cost and technology.

As technology to breakthrough the limitations of increasing the integration, there are methods that three-dimensionally integrate memory cells by stacking. However, in methods that simply stack and pattern one layer at a time, the number of processes undesirably increases as the number of stacks increases; and the costs undesirably increase. Therefore, technology has been proposed to form a stacked body on a silicon substrate by alternately stacking gate electrodes and insulating films; subsequently collectively patterning through-holes in the stacked body; depositing a blocking insulating layer, a charge storage film, and a tunneling insulating film in this order on the side face of the through-hole; and burying a silicon pillar in the interior of the through-hole.

In such a collectively patterned three-dimensionally stacked memory, a charge can be removed from and put into the charge storage layer from the silicon pillar to store information by forming a memory cell transistor at the intersection between each of the gate electrodes and the silicon pillar and by controlling the potentials of each of the gate electrodes and each of the silicon pillars. According to such technology, the through-holes can be made by collectively patterning the stacked body. Therefore, the number of lithography processes does not increase and cost increases can be suppressed even in the case where the number of stacks of the gate electrodes increases.

BRIEF DESCRIPTION OF THE DRAWINGS

FIGS. 8A to 8B are cross-sectional views of processes, illustrating the method for manufacturing the semiconductor memory device according to the embodiment;

FIGS. 20A to 20B are cross-sectional views of processes, illustrating the method for manufacturing the semiconductor memory device according to the embodiment;

FIG. 26A illustrates the first patterning and FIG. 26B illustrates the second patterning.

DETAILED DESCRIPTION

Figures 1A, 1B:
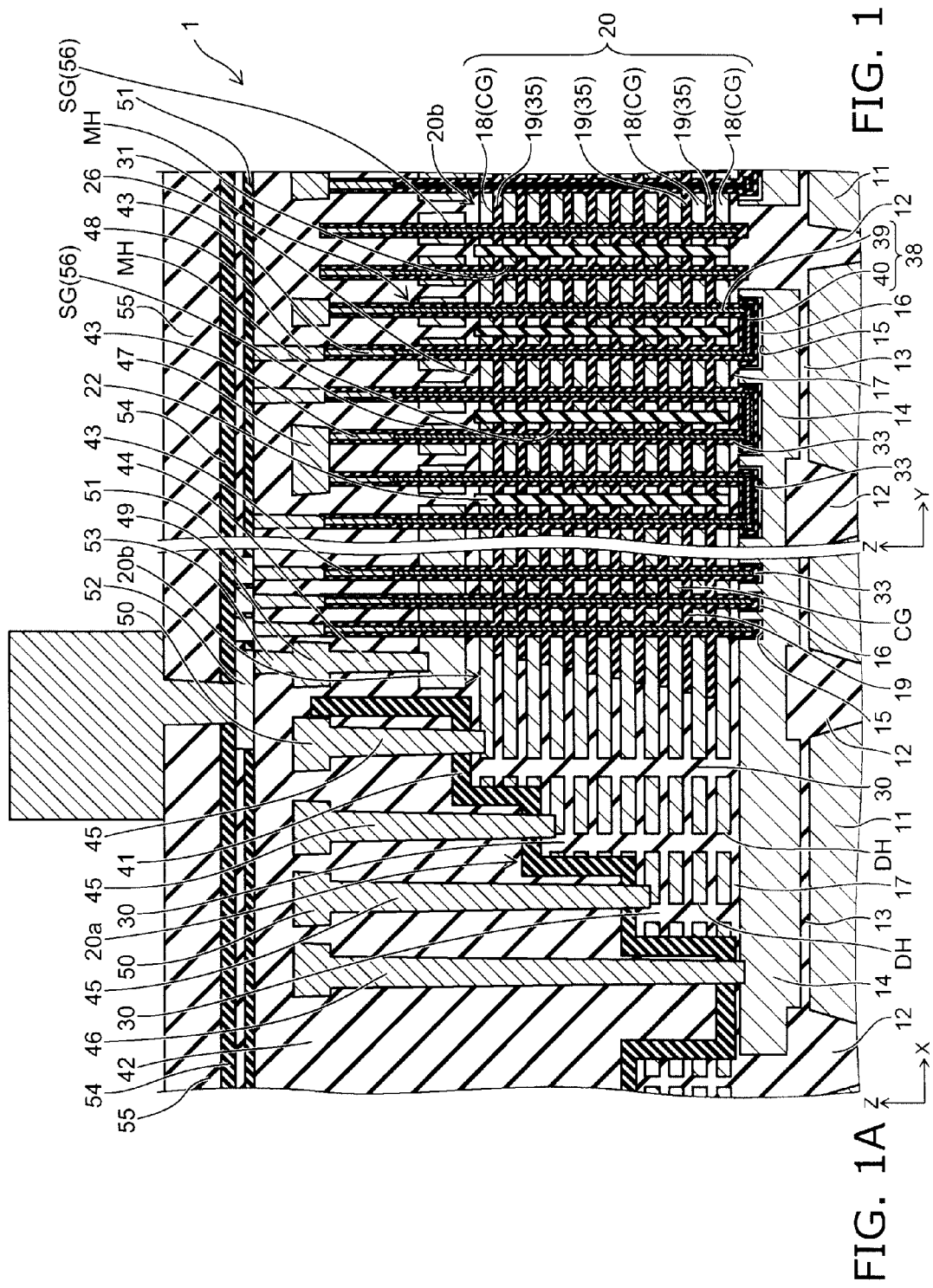
FIGS. 1A and 1B are cross-sectional views illustrating a semiconductor memory device according to an embodiment.

In general, according to one embodiment, a semiconductor memory device includes a stacked body, a contact, a semiconductor member, a charge storage layer, and a penetration member. The stacked body includes an electrode film stacked alternately with an insulating film. A configuration of an end portion of the stacked body is a stairstep configuration having a step provided every electrode film. The contact is connected to the electrode film from above the end portion. The semiconductor member is provided in a portion of the stacked body other than the end portion to pierce the stacked body in a stacking direction. The charge storage layer is provided between the electrode film and the semiconductor member. The penetration member pierces the end portion in the stacking direction. The penetration member does not include the same kind of material as the charge storage layer.

According to another embodiment, a semiconductor memory device includes a stacked body, a plurality of contacts, a columnar member, a semiconductor member, and a charge storage layer. The stacked body includes an electrode film stacked alternately with an insulating film. A configuration of an end portion of the stacked body is a stairstep configuration having a step provided every electrode film. The plurality of contacts is connected to the electrode films respectively from above the end portion. The columnar member pierces the stacked body in a stacking direction. The semiconductor member is provided in a portion of the stacked body other than the end portion to pierce the stacked body in a stacking direction. The charge storage layer is provided between the electrode film and the semiconductor member. The plurality of contacts is arranged in a matrix configuration as viewed from the stacking direction. The columnar member is disposed to include a center of a rectangle formed by four of the contacts.

According to yet another embodiment, a method is disclosed for manufacturing a semiconductor memory device. The method can include forming a stacked body by alternately stacking a conductive layer and a sacrificial layer. The method can include forming a columnar member piercing the stacked body in a stacking direction. The method can include making a dummy hole piercing an end portion of the stacked body in the stacking direction. The method can include removing one portion of the sacrificial layer via the dummy hole. The method can include filling an insulating material into the dummy hole and a space where the one portion of the sacrificial layer is removed. The method can include making a memory hole piercing a portion of the stacked body other than the end portion in the stacking direction. The method can include removing one other portion of the sacrificial layer via the memory hole. The method can include filling an insulating material into a space where the one other portion of the sacrificial layer is removed. The method can include forming a charge storage layer on a side face of the memory hole. The method can include forming a semiconductor member in the memory hole. The method can include patterning the end portion of the stacked body into a stairstep configuration having a step formed every electrode film. The method can include forming an inter-layer insulating film covering the end portion. In addition, the method can include forming contacts in the inter-layer insulating film to connect to the electrode films respectively.

Embodiments of the invention will now be described with reference to the drawings.

FIGS. 1A and 1B are cross-sectional views illustrating the semiconductor memory device according to this embodiment.

Figure 2:
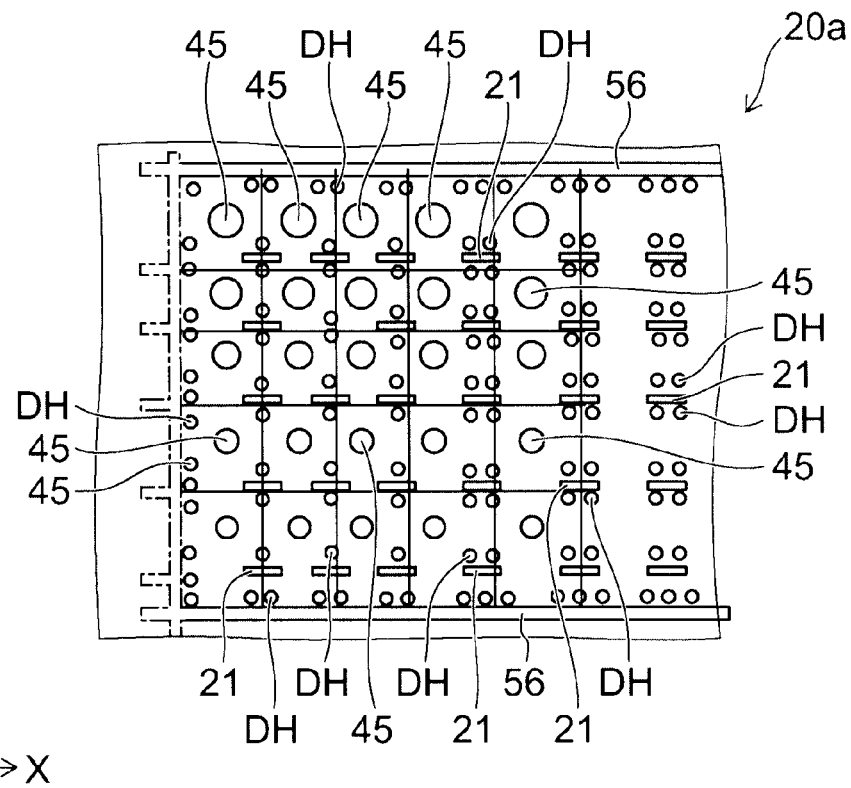
FIG. 2 is a plan view illustrating an end portion of a stacked body of the semiconductor memory device according to the embodiment.

FIG. 2 is a plan view illustrating an end portion of a stacked body of the semiconductor memory device according to this embodiment.

Figure 3:
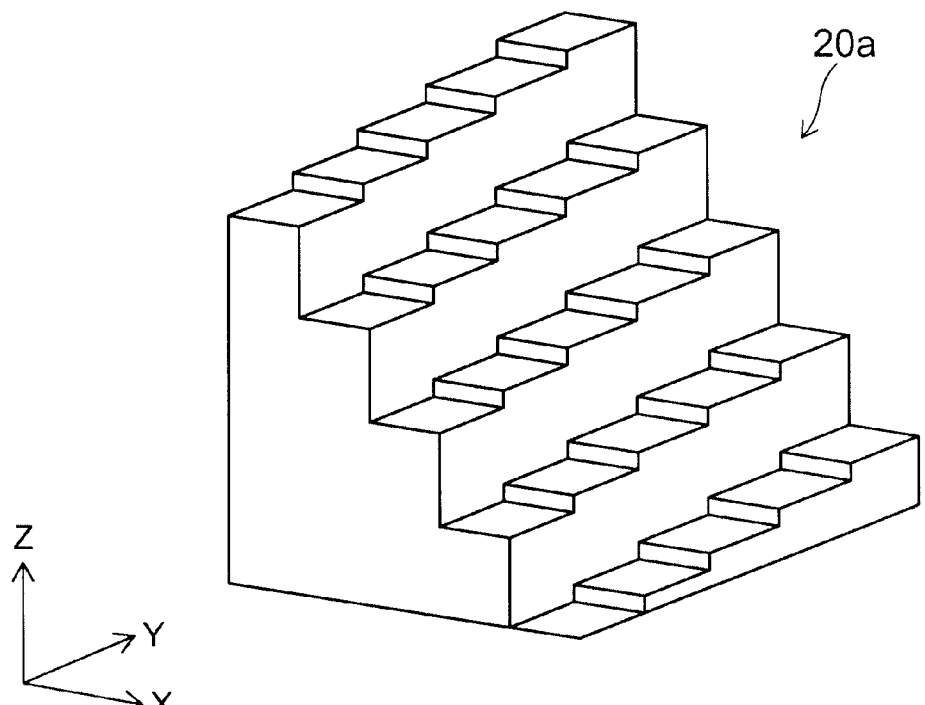
FIG. 3 is a perspective view illustrating the end portion of the stacked body of the semiconductor memory device according to the embodiment.

FIG. 3 is a perspective view illustrating the end portion of the stacked body of the semiconductor memory device according to this embodiment.

Figure 4:
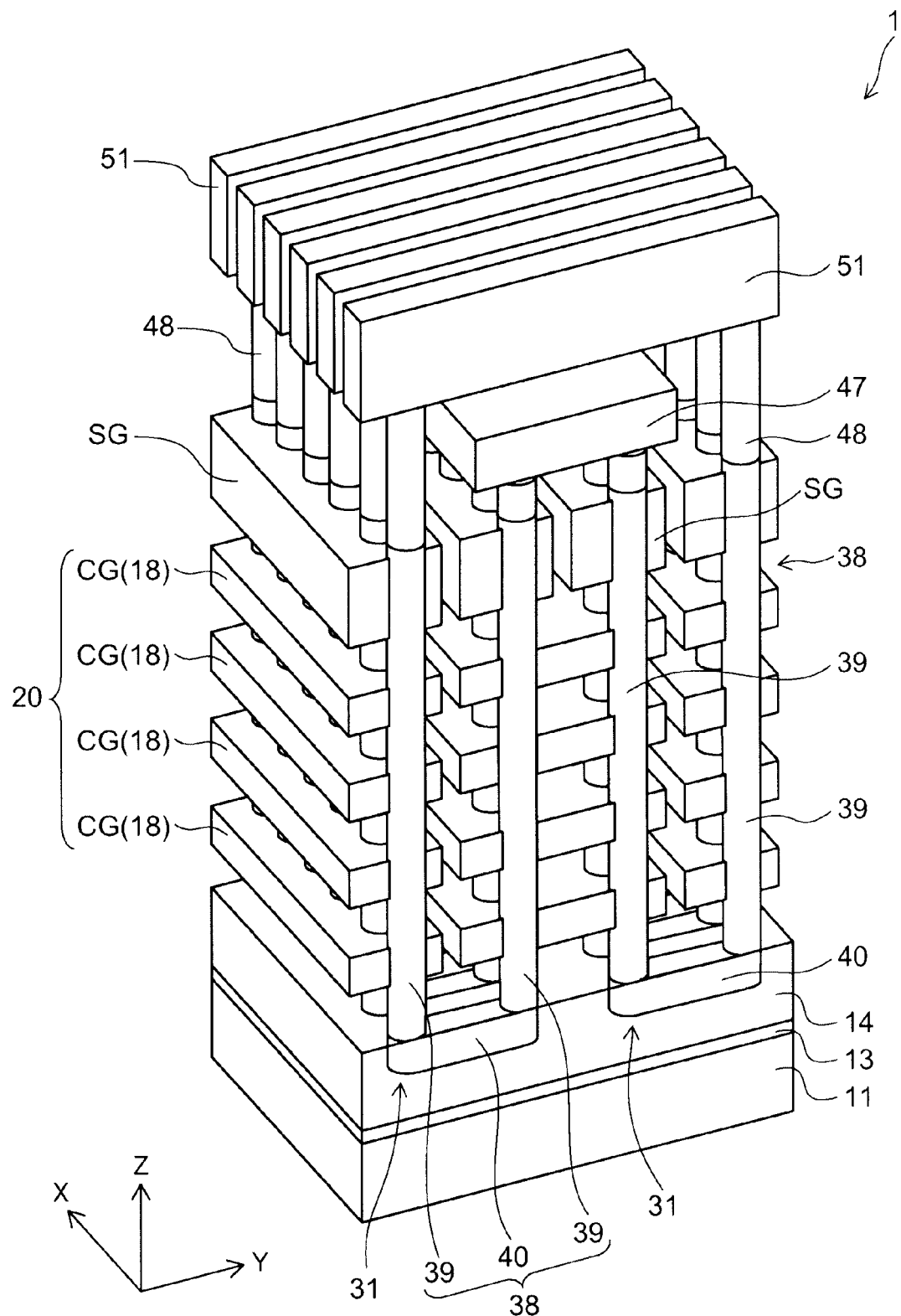
FIG. 4 is a perspective view illustrating a cell portion of the stacked body of the semiconductor memory device according to the embodiment.

FIG. 4 is a perspective view illustrating a cell portion of the stacked body of the semiconductor memory device according to this embodiment.

Figure 5:
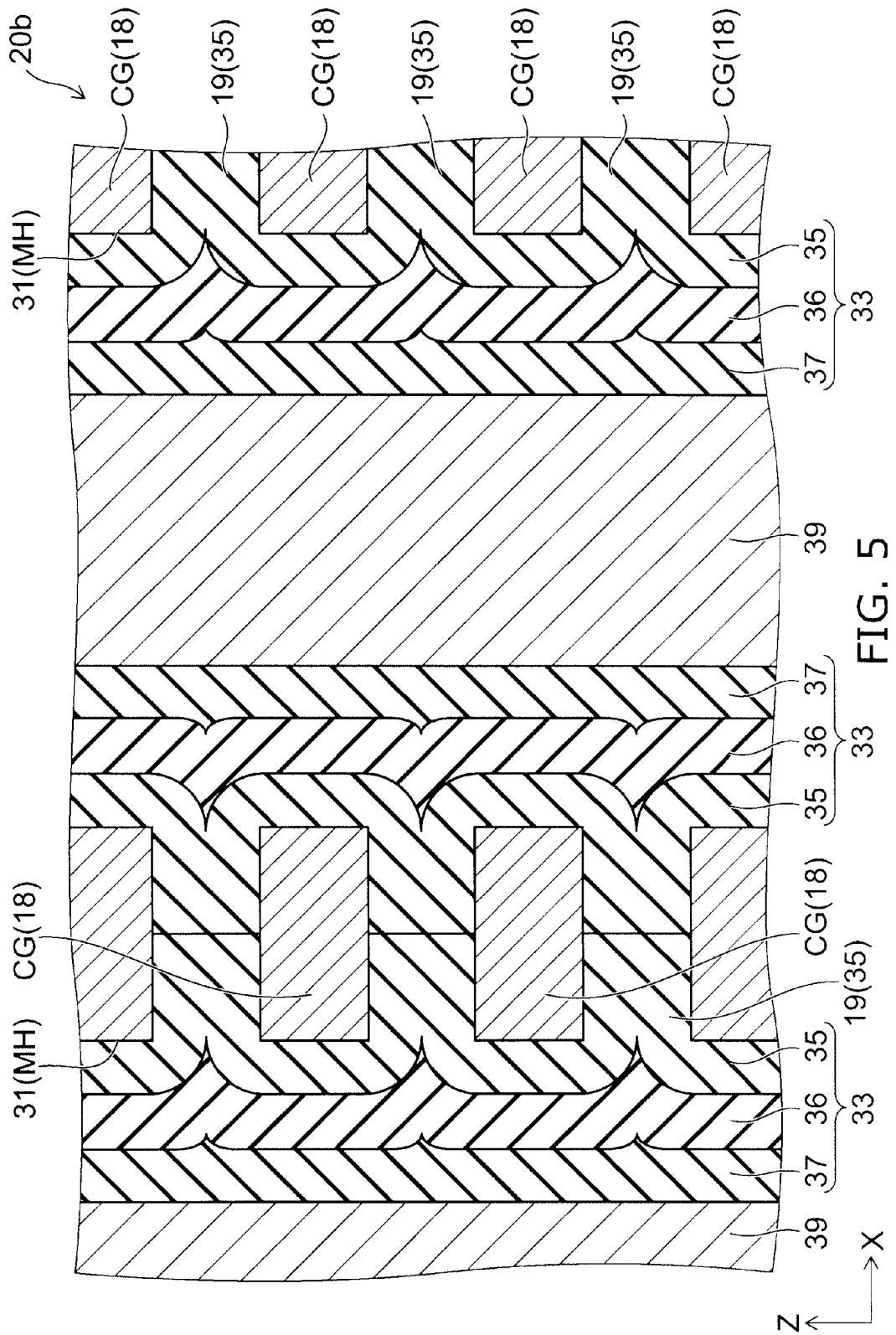
FIG. 5 is a cross-sectional view schematically illustrating the cell portion of the stacked body of the semiconductor memory device according to the embodiment.

FIG. 5 is a cross-sectional view schematically illustrating the cell portion of the stacked body of the semiconductor memory device according to this embodiment.

For easier viewing of the drawings, illustrations in the drawings are simplified appropriately. For example, the number of stacks of the electrode films is illustrated as being less than the actual number and is not necessarily matched between the drawings.

As illustrated in FIGS. 1A and 1B, a silicon substrate 11 is provided in a semiconductor memory device 1 according to this embodiment (hereinbelow, also referred to as simply the "device 1"). A STI (shallow trench isolation) 12 is selectively formed in the upper layer portion of the silicon substrate 11.

An XYZ orthogonal coordinate system will now be introduced for convenience of description in the specification. In the coordinate system, two mutually orthogonal directions parallel to the upper face of the silicon substrate 11 are taken as an X direction and a Y direction; and a direction orthogonal to both the X direction and the Y direction, i.e., a vertical direction, is taken as a Z direction.

A silicon oxide film 13 is formed on the silicon substrate 11; and a back gate electrode 14 made of a conductive material, e.g., silicon doped with phosphorus (phosphorus-doped silicon) is provided thereon. A recess 15 is multiply made in a rectangular parallelepiped configuration extending in the Y direction in the upper layer portion of the back gate electrode 14; and an insulating film having a low dielectric constant, e.g., a silicon oxide film 16, is provided on the inner face of the recess 15. A silicon oxide film 17 also is provided on the back gate electrode 14.

A stacked body 20 includes electrode films 18 and insulating films 19 stacked alternately on the silicon oxide film 17. The electrode film 18 is stacked in, for example, 24 layers.

The electrode film 18 is made of silicon to which boron is introduced (boron-doped silicon); and each of the electrode films 18 is subdivided into multiple band-like portions extending in the X direction. Each of the band-like portions forms a control gate CG. In other words, the control gate CG is arranged in a matrix configuration along the Y direction and the Z direction. However, every other one of the multiple control gates CG of one divided electrode film 18 layer is connected at the two X-direction end portions. In other words, each of the electrode films 18 is patterned into a pair of meshing comb-shaped configurations (not illustrated). The insulating film 19 is formed of, for example, silicon oxide.

The stacked body 20 is divided by function into two types of portions. Namely, the two X-direction end portions of the stacked body 20 are end portions 20a; and the portion of the stacked body 20 other than the end portions 20a is a cell portion 20b.

First, the end portion 20a of the stacked body 20 will be described.

As illustrated in FIG. 1A, FIG. 2, and FIG. 3, the end portion 20a mainly is a portion for connecting contacts 45 to the electrode films 18 of the stacked body 20. In FIG. 2, the inter-layer insulating film in which the contacts 45 are buried and the components thereabove are not illustrated. In FIG. 3, only the external form of the end portion 20*a* of the stacked body 20 is illustrated.

The end portion 20*a* is patterned into a chessboard-like stairstep configuration. A step is formed every electrode film of the stairstep. These steps are arranged in a chessboard-like configuration. For example, in the example illustrated in FIG. 2 and FIG. 3, the steps are arranged in a matrix configuration of 5 rows by 5 columns going up one level at a time when moving in the Y direction and going up 5 levels at a time when moving in the X direction. One contact 45 approaches each of the steps from above and is connected to the electrode film 18 disposed at the uppermost level of the step. A contact 44 is connected to the step above the steps to which the contacts 45 are connected; and a contact 46 is connected to the step below the steps to which the contacts 45 are connected. In other words, one of the contacts 44 to 46 is disposed at each of the steps as viewed from the Z direction. Accordingly, the contacts 44 to 46 also are arranged in a matrix configuration corresponding to the steps of the chessboard-like configuration as viewed from the Z direction.

In the end portion 20*a*, a columnar member 21 is multiply provided to pierce the stacked body 20 in the stacking direction thereof, i.e., the Z direction. The configuration of each of the columnar members 21 is a rectangular configuration having the longest length in the Z direction and the next longest length in the X direction. The columnar member 21 is disposed to include the center of a rectangle formed by four of the contacts 45 as viewed from the Z direction. The center of the rectangle is, for example, the intersection point of the diagonal lines. It is favorable for such an intersection point to be positioned in the interior of the columnar member 21 as viewed from the Z direction. However, the position of the columnar member 21 is not limited thereto. It is sufficient for the position to have roughly the same distances from the four contacts forming the rectangle.

Also in the end portion 20*a*, dummy holes DH are made to pierce the stacked body 20 in the Z direction. The dummy holes DH are disposed on two Y-direction sides of each of the columnar members 21. For example, one dummy hole DH is made on each of the two Y-direction sides of each of the columnar members 21 in the steps of the lower level. In the steps of the upper level, two dummy holes are made on each of the two Y-direction sides of each of the columnar members 21. The reason for this is that, due to constraints of processes described below, the steps need greater patterning margins and have longer Y direction lengths toward the upper level. A material of the same kind as the material of the insulating film 19, e.g., silicon oxide 30, is filled into the dummy holes DH. The silicon oxide 30 forms a penetration member that pierces the end portion 20*a* of the stacked body 20 in the Z direction.

Columnar members 56 having plate configurations parallel to the XZ plane are provided on the two Y-direction sides of the stacked body 20 as viewed from the Z direction. Similarly to the columnar member 21, the columnar member 56 is formed of, for example, silicon oxide. The dummy holes DH also are made at positions along the inner side faces of the columnar members 56. Such dummy holes DH also are disposed at positions as distal to the contacts 45 as possible.

The cell portion 20*b* of the stacked body 20 will now be described.

As illustrated in FIG. 1B, FIG. 4, and FIG. 5, a columnar member 22 made of, for example, silicon oxide is provided between the control gates CG adjacent to each other in the Y direction. The configuration of the columnar member 22 is a plate configuration spreading in the X direction and the Z direction to pierce the stacked body 20. The insulating film 19 is filled between the control gates CG adjacent to each other in the Z direction. A silicon oxide film 26 is provided on the stacked body 20; and a selection gate SG extending in the X direction and made of boron-doped silicon is multiply provided thereon. For convenience of illustration in FIG. 4, as a general rule, only the conductive portions are illustrated, and the insulating portions are not illustrated.

Multiple memory holes MH extending in the Z direction are made in the stacked body 20, the silicon oxide film 26, and the selection gates SG. The memory holes MH are arranged in a matrix configuration along the X direction and the Y direction to pierce the selection gates SG, the silicon oxide film 26, and the stacked body 20 to reach the two Y-direction end portions of the recesses 15. Thereby, the memory holes MH of one pair adjacent to each other in the Y direction communicate with each other by the recess 15 to form one U-shaped hole 31. The configuration of each of the memory holes MH has, for example, a circular columnar shape; and the configuration of each of the U-shaped holes 31 is U-shaped. Each of the control gates CG is pierced by two columns of the memory holes MH arranged along the X direction. Because the arrangement of the recesses 15 and the arrangement of the control gates CG in the Y direction have the same arrangement period with the phases shifted by half a period, the two columns of the memory holes MH piercing each of the control gates CG belong to mutually different U-shaped holes 31.

As illustrated in FIG. 5, a blocking insulating layer 35 is provided on an inner face of the U-shaped hole 31. The blocking insulating layer 35 is a layer in which current substantially does not flow even in the case where a voltage in the range of the drive voltage of the device 1 is applied. The blocking insulating layer 35 is formed of a high dielectric constant material, e.g., silicon oxide, e.g., a material having a dielectric constant higher than the dielectric constant of the material of a charge storage layer 36 described below. The blocking insulating layer 35 extends around from the inner face of the memory hole MH onto the upper face and the lower face of each of the control gates CG to cover the upper face and the lower face of each of the control gates CG. The portion of the blocking insulating layer 35 that extends around onto the upper face and the lower face of the control gate CG forms the insulating film 19.

The charge storage layer 36 is provided on the blocking insulating layer 35. The charge storage layer 36 is a layer capable of storing charge, e.g., a layer including trap sites of electrons, e.g., a layer made of silicon nitride. For example, the charge storage layer 36 is disposed only in the U-shaped hole 31 and does not enter between control gates CG adjacent to each other in the Z direction.

A tunneling insulating layer 37 is provided on the charge storage layer 36. Although the tunneling insulating layer 37 normally is insulative, the tunneling insulating layer 37 is a layer in which a tunneling current flows when a prescribed voltage within the range of the drive voltage of the device 1 is applied. The tunneling insulating layer 37 is formed of, for example, silicon oxide. The tunneling insulating layer 37 also is disposed only in the U-shaped hole 31 and does not enter between control gates CG adjacent to each other in the Z direction. A memory film 33 is formed by stacking the blocking insulating layer 35, the charge storage layer 36, and the tunneling insulating layer 37. The memory film 33 is not provided in the dummy hole DH made in the end portion 20*a* described above. Accordingly, the charge storage layer 36 made of silicon nitride also is not provided in the dummy hole DH. In other words, the penetration member filled into the dummy hole DH does not include the same kind of material as the charge storage layer 36, that is, does not include silicon nitride.

A U-shaped pillar 38 is formed by filling polysilicon to which an impurity, e.g., phosphorus, is introduced into the U-shaped hole 31. The configuration of the U-shaped pillar 38 is U-shaped reflecting the configuration of the U-shaped hole 31. The U-shaped pillar 38 contacts the tunneling insulating layer 37. The portions of the U-shaped pillar 38 disposed in the memory holes MH form silicon pillars 39; and the portion of the U-shaped pillar 38 disposed in the recess 15 forms a connection member 40. The configuration of the silicon pillar 39 has a circular columnar shape reflecting the configuration of the memory hole MH; and the configuration of the connection member 40 is a rectangular parallelepiped configuration reflecting the configuration of the recess 15.

The periphery of the stacked body 20 will now be described.

As illustrated in FIGS. 1A and 1B, a silicon nitride film 41 is provided above the end portion 20a of the stacked body 20 patterned into the stairstep configuration. The configuration of the silicon nitride film 41 is a stairstep configuration reflecting the configuration of the end portion of the stacked body 20. An inter-layer insulating film 42 made of, for example, silicon oxide is provided on the selection gate SG and on the silicon nitride film 41 to bury the stacked body 20.

A plug 43 and the contacts 44 to 46 are buried in the inter-layer insulating film 42. The plug 43 is disposed in the region directly on the silicon pillar 39 and is connected to the silicon pillar 39. The contact 44 is disposed in the region directly on one X-direction end portion of the selection gate SG and is connected to the selection gate SG. As described above, the contact 45 is disposed in the region directly on the X-direction end portion of the electrode film 18 (the control gate CG) and is connected to the electrode film 18. The contact 46 is connected to the back gate electrode 14.

A source line 47, a plug 48, and interconnects 49 and 50 are buried in a portion of the inter-layer insulating film 42 above the plug 43 and the contacts 44 to 46. The source line 47 extends in the X direction and is connected to one of the pair of silicon pillars 39 belonging to the U-shaped pillar 38 via the plug 43. The plug 48 is connected to the one other of the pair of silicon pillars 39 belonging to the U-shaped pillar 38 via the plug 43. The interconnects 49 and 50 extend in the Y direction and are connected to the contacts 44 and 45, respectively.

A bit line 51 extending in the Y direction is provided on the inter-layer insulating film 42 and connected to the plug 48. An interconnect 52 is provided on the inter-layer insulating film 42 and connected to the interconnect 49 via a plug 53. A silicon nitride film 54 and an inter-layer insulating film 55 are provided on the inter-layer insulating film 42 to bury the bit line 51 and the interconnect 52; and the prescribed interconnects and the like are buried.

In the device 1, memory cell transistors are formed at the intersections between the control gates CG and the silicon pillar 39; and a selection transistor is formed at the intersection between the selection gate SG and the silicon pillar 39. Thereby, multiple memory cell transistors are mutually connected in series between the bit line 51 and the source line 47; and a memory string is formed to which the selection transistors are connected on both sides.

A method for manufacturing the semiconductor memory device according to this embodiment will now be described.

FIG. 6A to FIG. 25B are cross-sectional views of processes, illustrating the method for manufacturing the semiconductor memory device according to this embodiment. In these drawings, drawing A and drawing B illustrate mutually orthogonal cross sections.

Figures 21A, 21B:
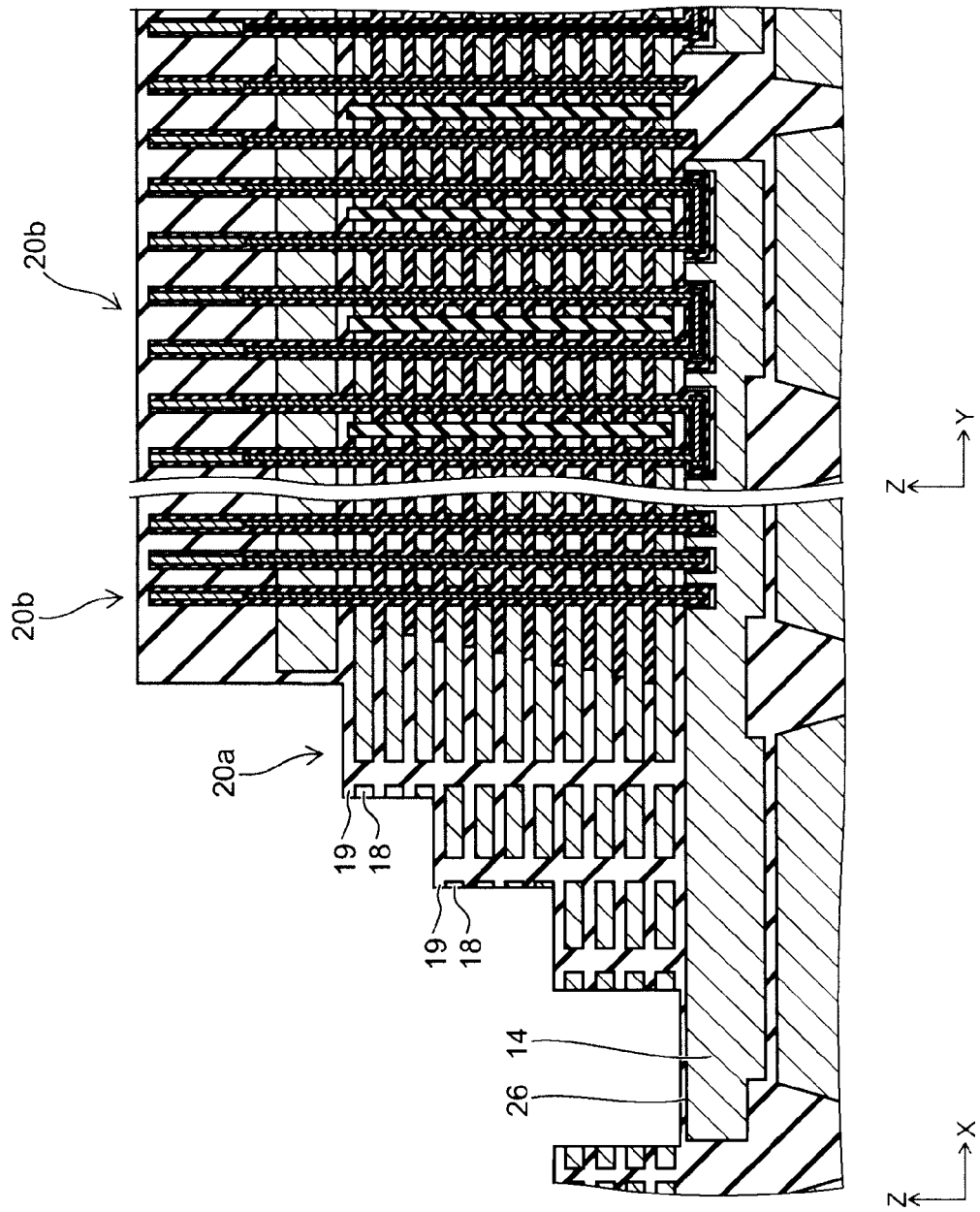
FIGS. 21A to 21B are cross-sectional views of processes, illustrating the method for manufacturing the semiconductor memory device according to the embodiment.
Figure 26A:
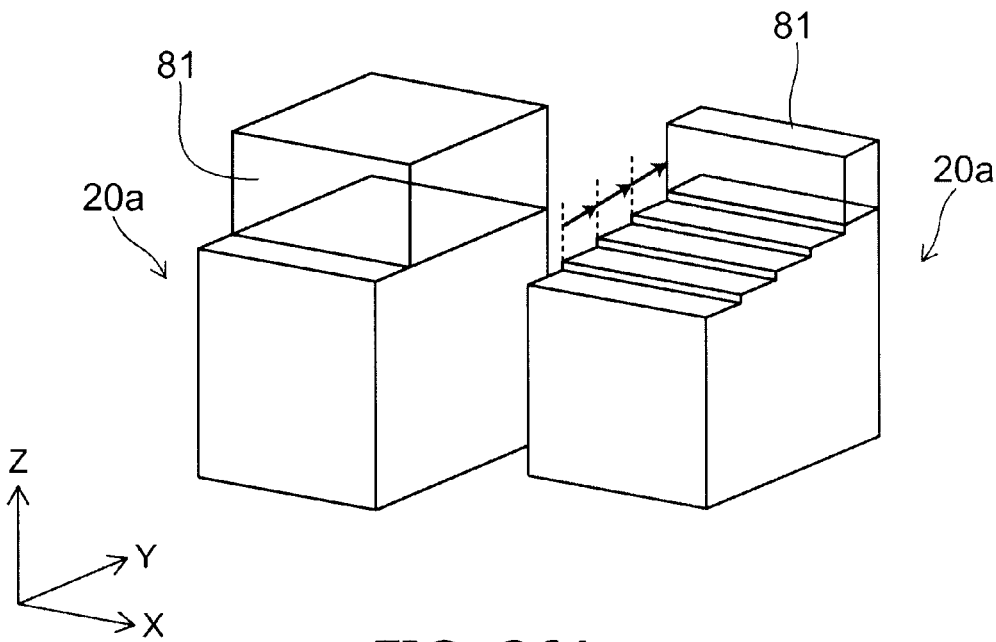
FIGS. 26A and 26B are perspective views schematically illustrating a method for patterning the stacked body illustrated in FIGS. 21A and 21B, where
Figure 26B:
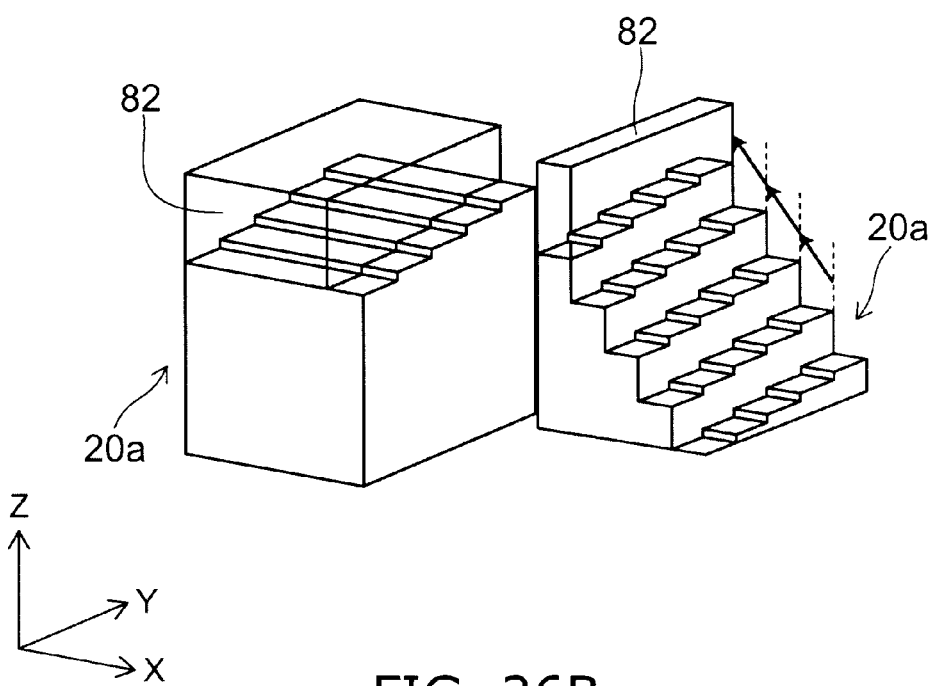

FIGS. 26A and 26B are perspective views schematically illustrating the method for patterning the stacked body illustrated in FIGS. 21A and 21B. FIG. 26A illustrates the first patterning and FIG. 26B illustrates the second patterning.

The method for manufacturing the semiconductor memory device according to this embodiment can be divided roughly into stages (1) to (6) recited below.

Figures 6A, 6B:
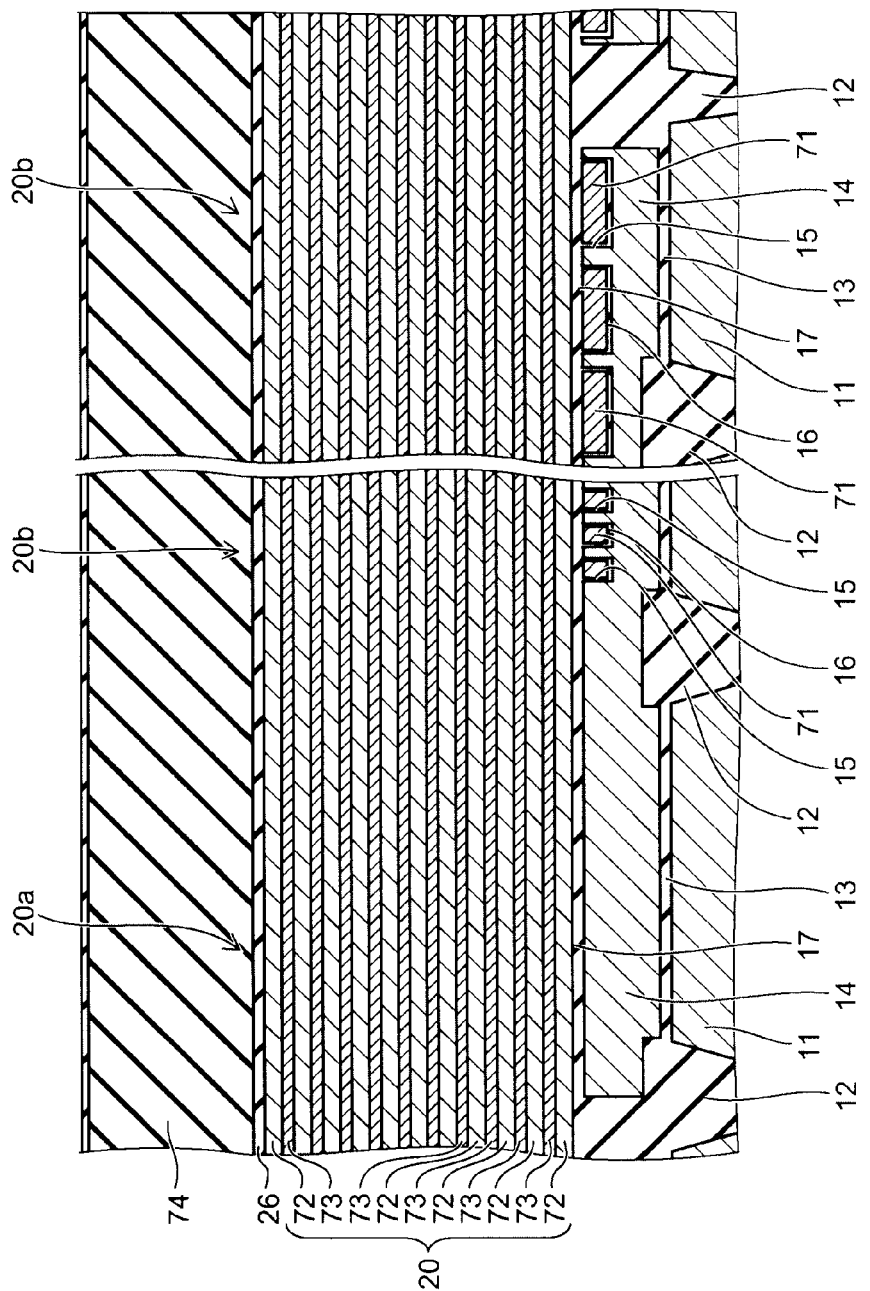
FIGS. 6A to 6B are cross-sectional views of processes, illustrating a method for manufacturing the semiconductor memory device according to the embodiment.

(1) A stacked body is formed by alternately stacking a non-doped silicon layer and a boron-doped silicon layer (FIGS. 6A and 6B).

(2) A columnar member is formed in the stacked body (FIG. 7A to FIG. 9B).

(3) A dummy hole is made in the end portion of the stacked body; the non-doped silicon layer is removed from the end portion of the stacked body via the dummy hole; and silicon oxide is filled (FIG. 10A to FIG. 13B).

(4) A memory hole is made in the cell portion of the stacked body; the non-doped silicon layer is removed from the cell portion via the memory hole; and the memory cells are formed by filling a memory film and a silicon pillar (FIG. 14A to FIG. 19B).

(5) The end portion of the stacked body is patterned into a stairstep configuration (FIG. 20A to FIG. 21B).

(6) The contacts and the interconnects are formed (FIG. 22A to FIG. 25B).

Stage (4) of making the memory cells recited above can be implemented at any timing between stage (2) of forming the columnar member recited above and stage (6) of forming the contacts and the like recited above. In other words, stage (4) recited above may be implemented between stage (2) recited above and stage (3) recited above or between stage (5) recited above and stage (6) recited above. In this embodiment, an example is described in which stages (1) to (6) recited above are implemented in this order.

First, the silicon substrate 11 is prepared as illustrated in FIGS. 6A and 6B. Then, the STI 12 is selectively formed in the upper layer portion of the silicon substrate 11. Continuing, the silicon oxide film 13 is formed on the upper face of the silicon substrate 11. Then, the back gate electrode 14 is formed by forming a film made of polysilicon doped with phosphorus and patterning. Continuing, the recess 15 having the rectangular parallelepiped configuration with the longitudinal direction in the Y direction is made by photolithography in the upper face of the back gate electrode 14. The recess 15 is made in multiple regions to be arranged in a matrix configuration along the X direction and the Y direction.

Then, the silicon oxide film 16 is formed on the inner face of the recess 15. Continuing, silicon to which an impurity is not introduced (non-doped silicon) is deposited on the entire surface; and etching of the entire surface is performed. Thereby, the non-doped silicon is removed from the upper face of the back gate electrode 14 and remains in the recess 15. As a result, the region of the upper face of the back gate electrode 14 between the recesses 15 is exposed and a non-doped silicon member 71 is filled into the recesses 15.

Continuing, the silicon oxide film 17 is formed on the entire surface of the back gate electrode 14. The film thickness of the silicon oxide film 17 is a film thickness thick enough to ensure the breakdown voltage between the back gate electrode 14 and the control gate CG of the lowermost level of the control gates CG (referring to FIGS. 1A and 1B) formed on the silicon oxide film 17 in a subsequent process.

Then, a boron-doped silicon layer 72 is formed as a conductive layer by, for example, depositing silicon doped with boron using CVD (chemical vapor deposition). The boron-doped silicon layer 72 is a layer used to form the electrode film 18 of the completed device 1 and therefore has a thickness thick enough to realize the function as the control gate CG of the device 1. Then, a non-doped silicon layer 73 is formed as a sacrificial layer by, for example, depositing non-doped silicon using CVD. The thickness of the non-doped silicon layer 73 corresponds to the thickness of an insulating film capable of ensuring the breakdown voltage between the electrode films 18.

Similarly thereafter, the boron-doped silicon layer 72 and the non-doped silicon layer 73 are alternately stacked to form the stacked body 20. The number of stacks of the boron-doped silicon layer 72 is taken to be, for example, 24 layers; and the uppermost layer of the stacked body 20 is taken to be the boron-doped silicon layer 72. Subsequently, the silicon oxide film 26 is formed on the stacked body 20; and a mask film 74 made of, for example, BSG (boron silicate glass) is formed thereon.

Figures 7A, 7B:
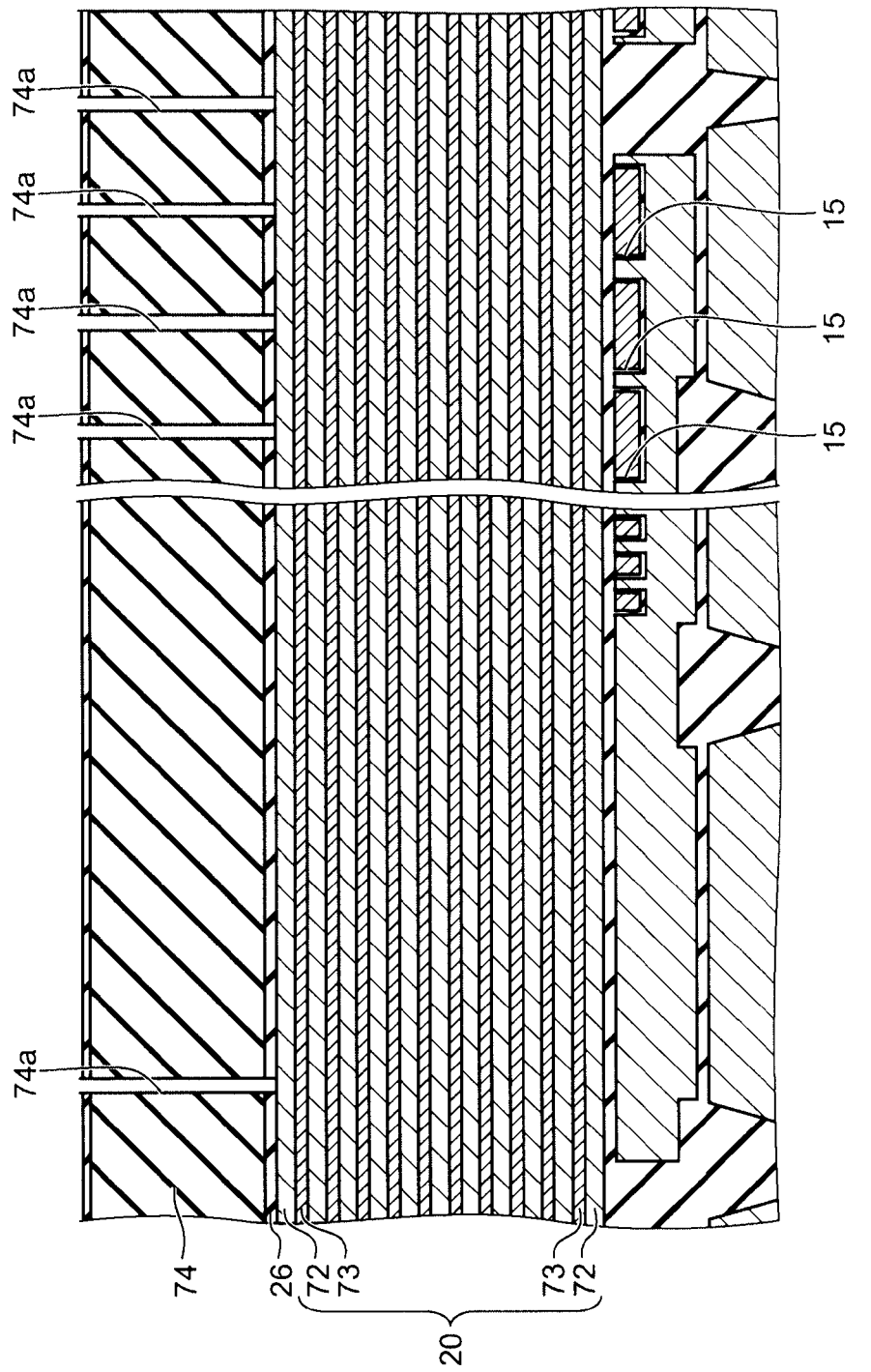
FIGS. 7A to 7B are cross-sectional views of processes, illustrating the method for manufacturing the semiconductor memory device according to the embodiment.

Then, as illustrated in FIGS. 7A and 7B, the mask film 74 is patterned by photolithography and RIE (reactive ion etching) to make slits 74a in the regions where the columnar members 21, 22, and 56 (referring to FIGS. 1A and 1B and FIG. 2) are to be formed. At this time, the slit 74a corresponding to the columnar member 21 is made to include the center of the rectangle having the regions where four contacts of the contacts 44 to 46 are to be made as the corners. The slit 74a corresponding to the columnar member 22 is made to extend in the X direction to pass through the region directly on the recess 15. The slit 74a corresponding to the columnar member 56 is formed in a frame-like configuration to enclose the region to be partitioned as one stacked body 20 of the completed device 1 as viewed from the Z direction.

Continuing as illustrated in FIGS. 8A and 8B, RIE is performed using the mask film 74 (referring to FIGS. 7A and 7B) as a mask to make a slit 23 in the stacked body 20. The slit 23 is made in the region directly under the slit 74a to pierce the stacked body 20 in the Z direction. Subsequently, the mask film 74 is removed.

Figures 9A, 9B:
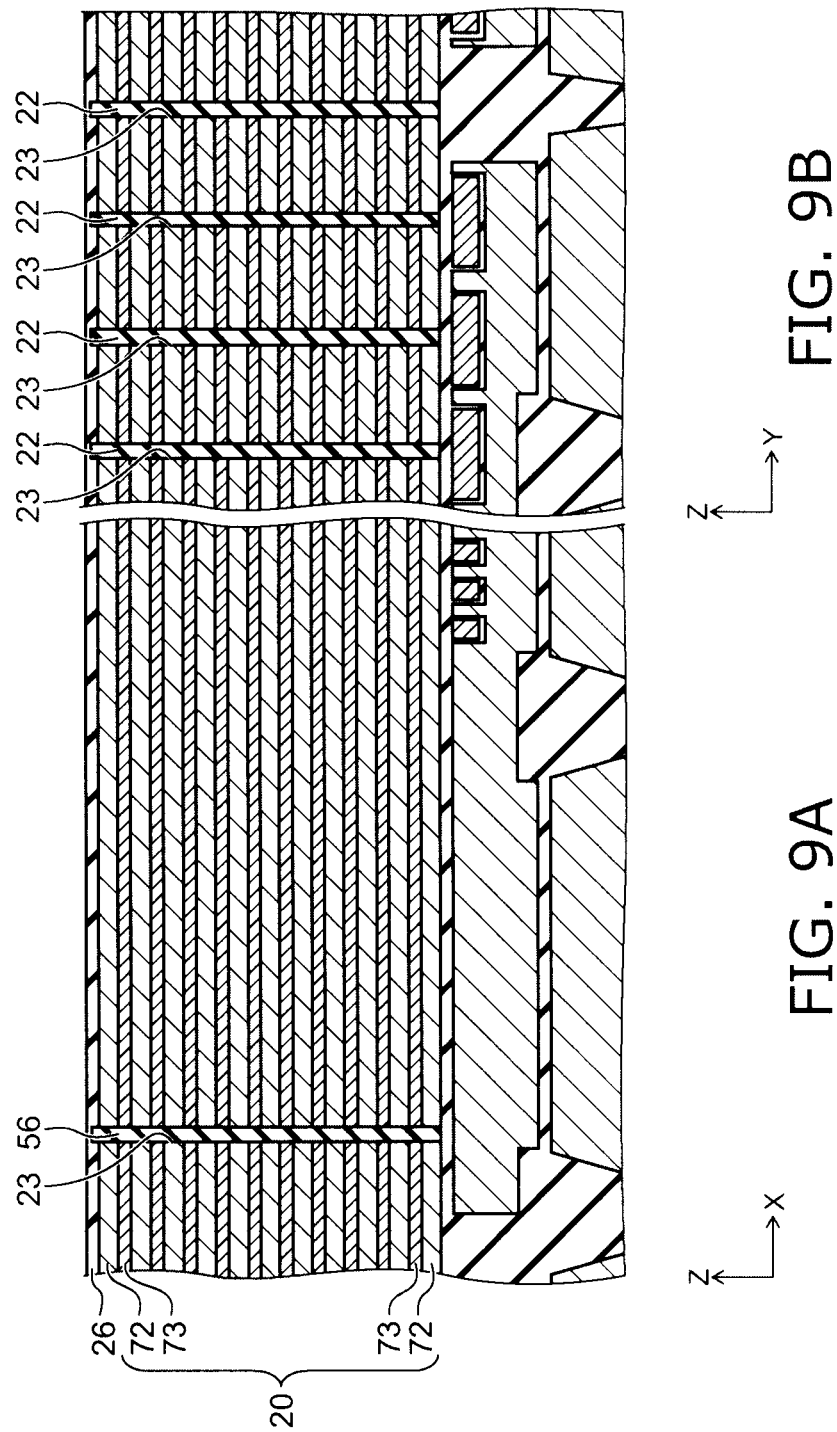
FIGS. 9A to 9B are cross-sectional views of processes, illustrating the method for manufacturing the semiconductor memory device according to the embodiment.

Then, as illustrated in FIGS. 9A and 9B, an insulating material such as silicon oxide is deposited on the entire surface. At this time, the insulating material also is filled into the slits 23. Subsequently, the entire surface is etched to remove the insulating material from the upper face of the stacked body 20 and leave the insulating material in the slits 23. Thereby, the columnar members 21 (referring to FIG. 2), 22, and 56 made of silicon oxide are formed in the slits 23.

Figures 10A, 10B:
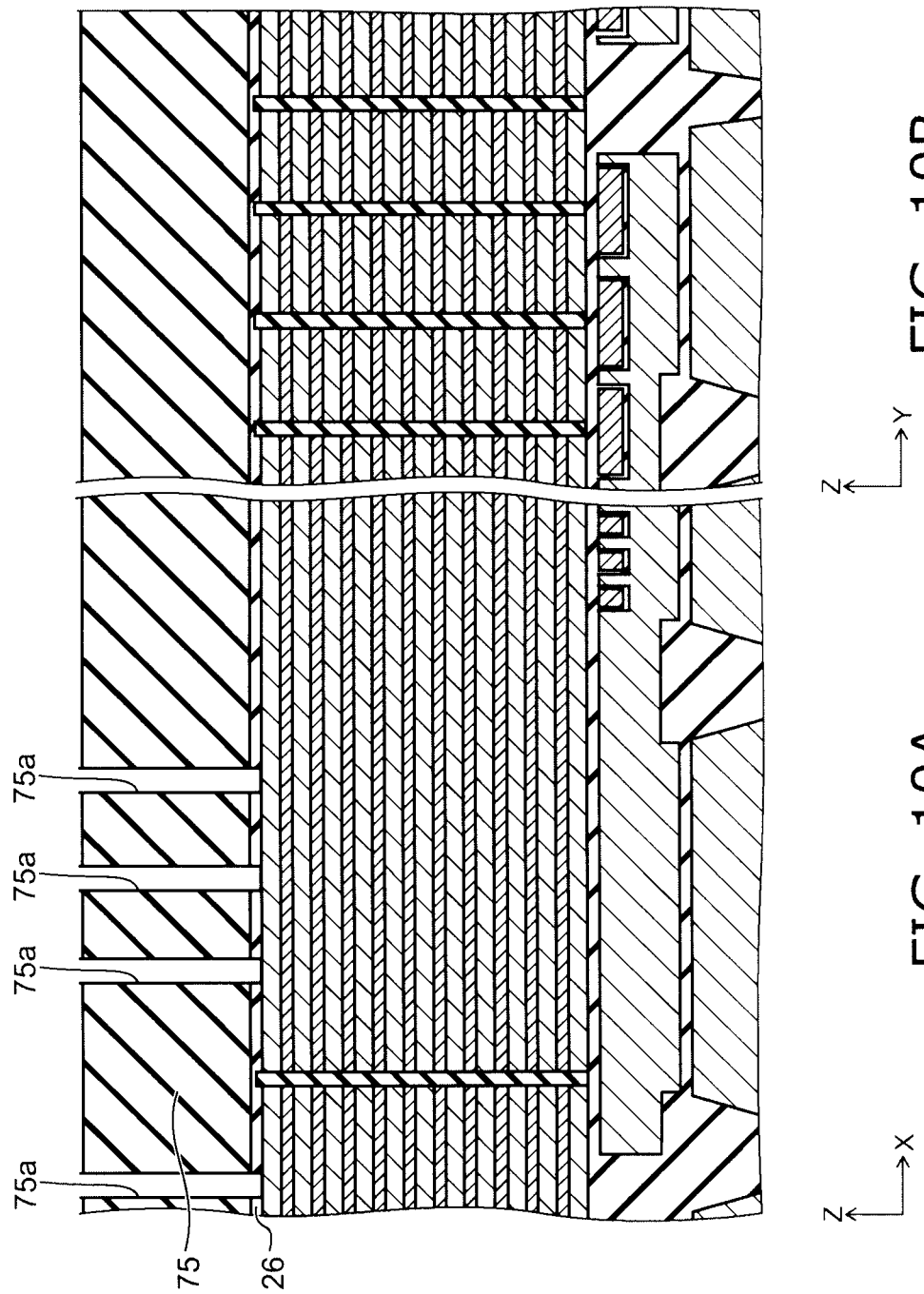
FIGS. 10A to 10B are cross-sectional views of processes, illustrating the method for manufacturing the semiconductor memory device according to the embodiment.

Continuing as illustrated in FIGS. 10A and 10B, a mask film 75 made of BSG is formed on the silicon oxide film 26; and through-holes 75a are made in the regions where the dummy holes DH (referring to FIGS. 1A and 1B) are to be made using photolithography and etching. At this time, a portion of the through-holes 75a are made on the two Y-direction sides of each of the columnar members 21; and the other through-holes 75a are made along the inner side face of the columnar member 56.

Figures 11A, 11B:
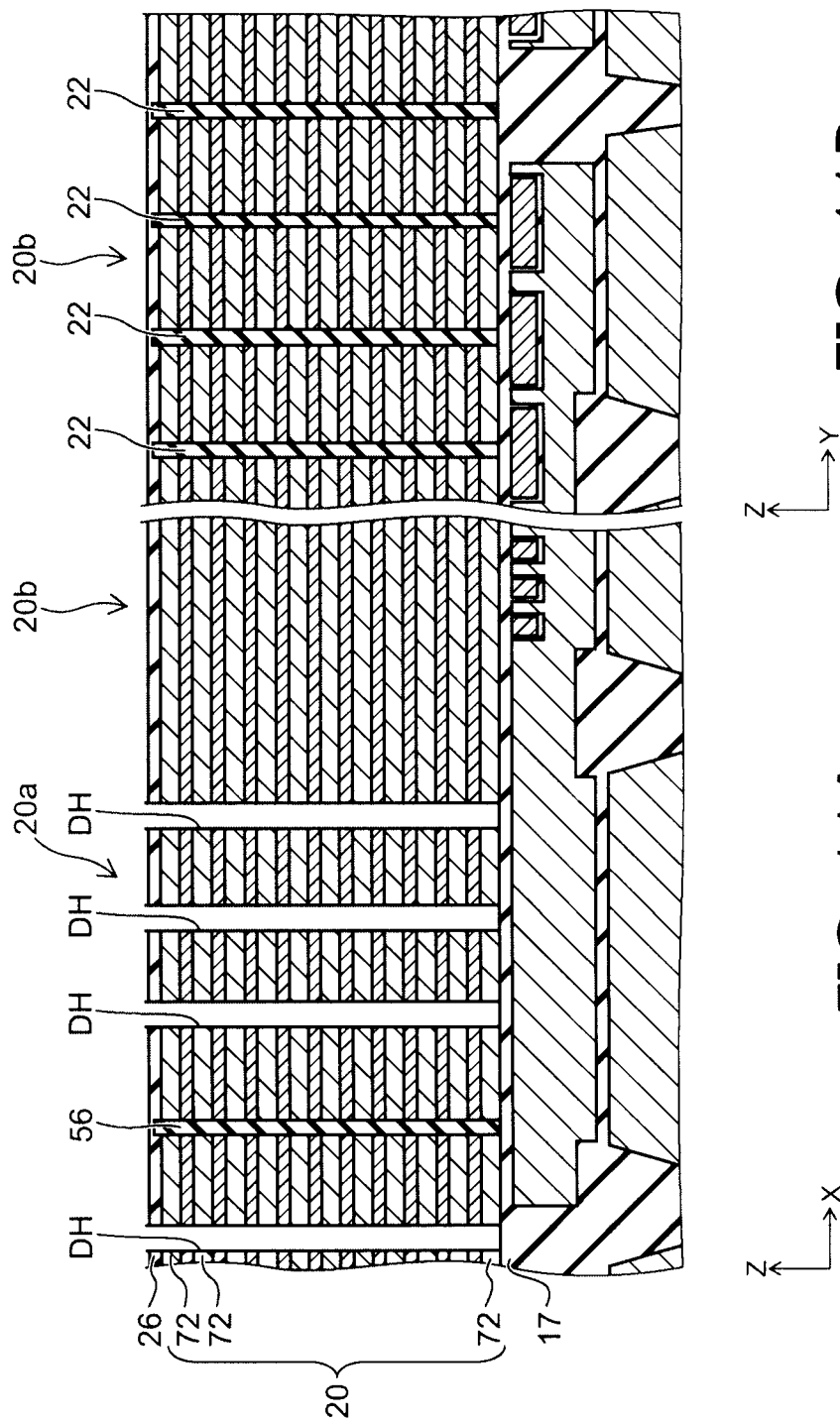
FIGS. 11A to 11B are cross-sectional views of processes, illustrating the method for manufacturing the semiconductor memory device according to the embodiment.

Then, as illustrated in FIGS. 11A and 11B, RIE is performed using the mask film 75 (referring to FIGS. 10A and 10B) as a mask to make the dummy holes DH in the end portion 20a of the stacked body 20 to pierce the stacked body 20 in the Z direction using RIE. Subsequently, the mask film 75 is removed.

Figures 12A, 12B:
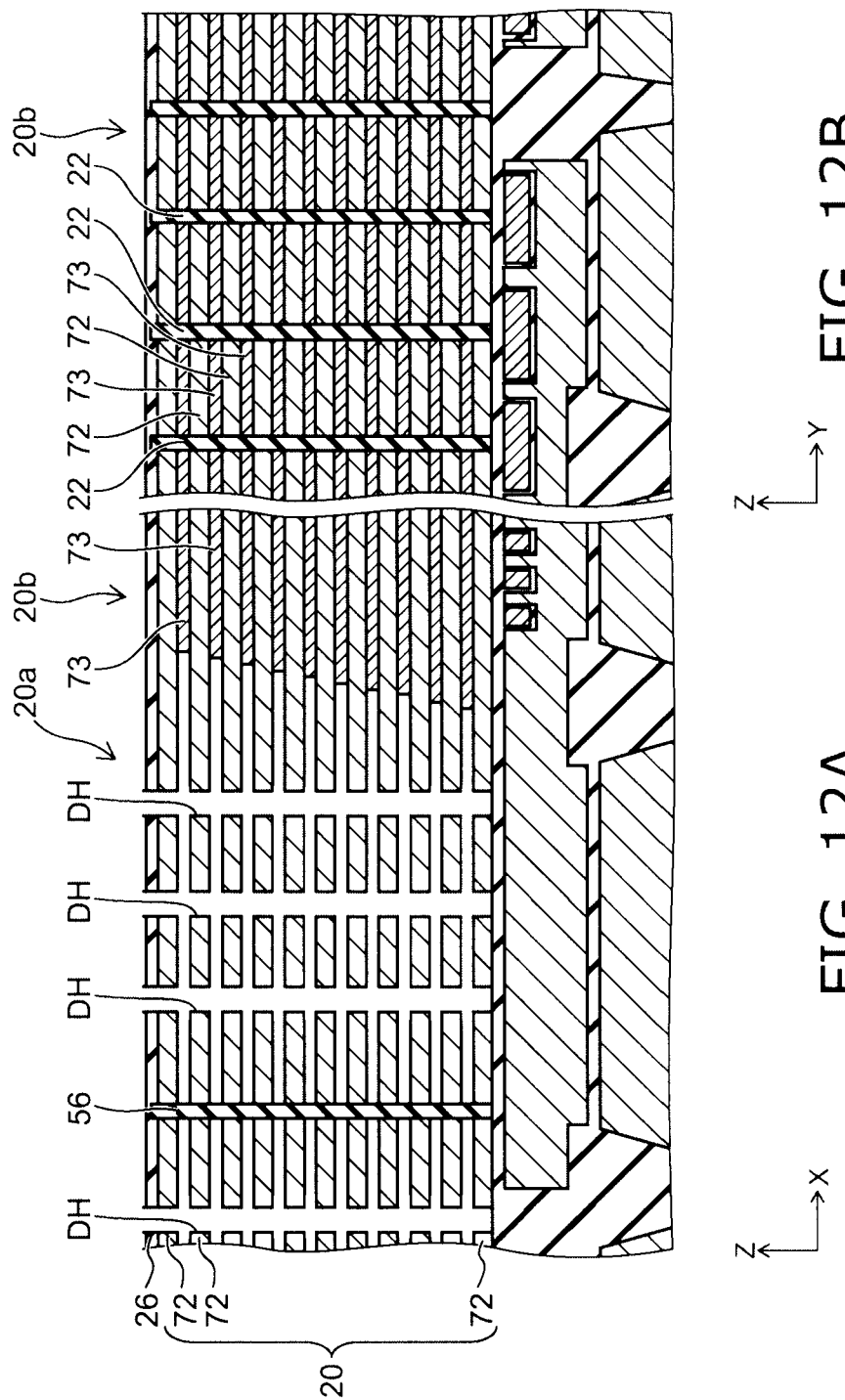
FIGS. 12A to 12B are cross-sectional views of processes, illustrating the method for manufacturing the semiconductor memory device according to the embodiment.

Continuing as illustrated in FIGS. 12A and 12B, wet etching is performed via the dummy holes DH to remove a portion of the non-doped silicon layers 73. Such wet etching is performed using, for example, an alkaline etchant. Thereby, the portion of the non-doped silicon layers 73 disposed in the end portion 20a of the stacked body 20 is removed. At this time, the boron-doped silicon layers 72 of the end portion 20a are supported by the columnar members 21 (referring to FIG. 2) and 56.

Figures 13A, 13B:
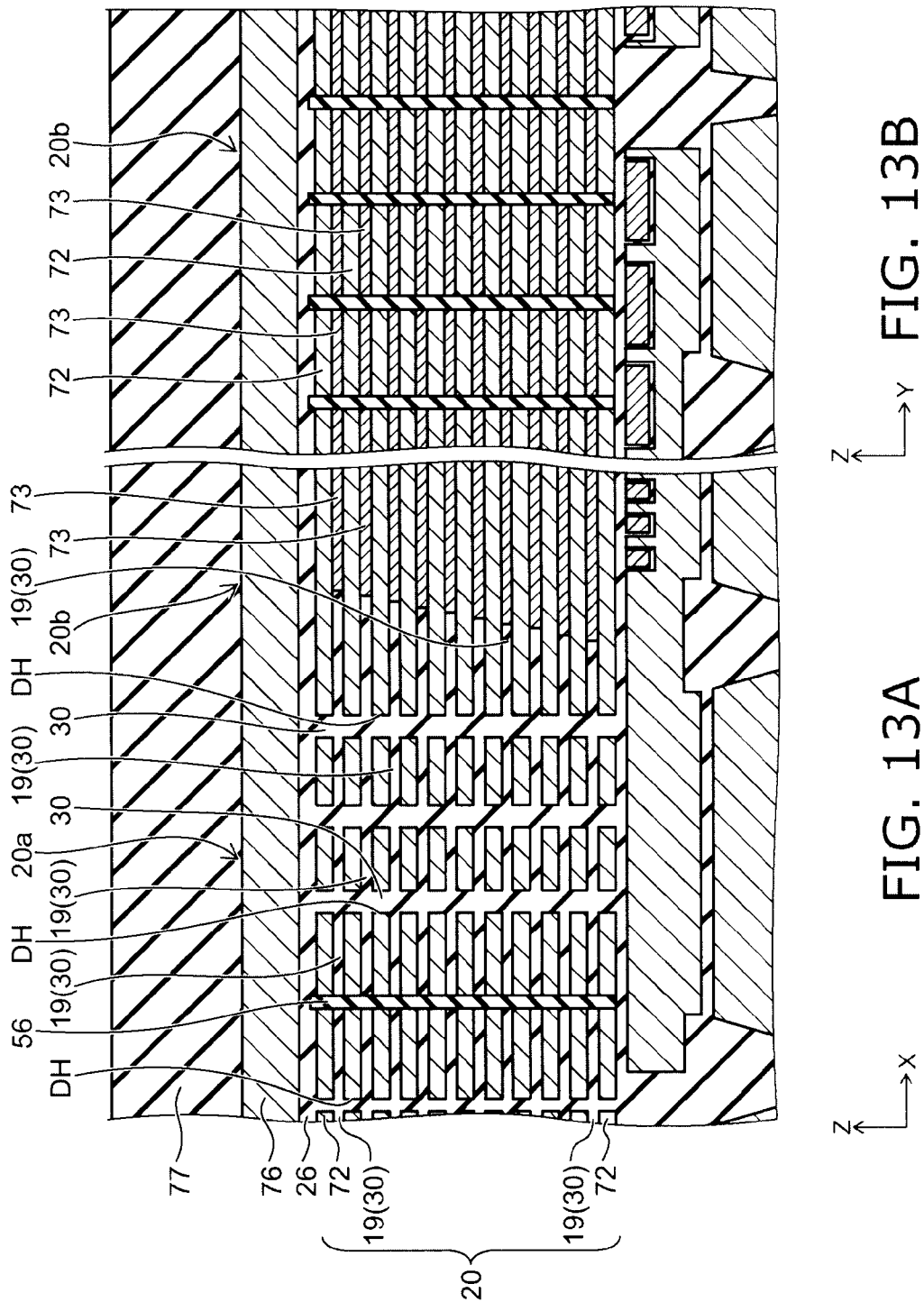
FIGS. 13A to 13B are cross-sectional views of processes, illustrating the method for manufacturing the semiconductor memory device according to the embodiment.

Then, as illustrated in FIGS. 13A and 13B, silicon oxide is deposited on the entire surface. Thereby, the silicon oxide 30 enters via the dummy holes DH into the space where the portion of the non-doped silicon layers 73 is removed and is filled also into the dummy holes DH. The silicon oxide 30 that enters into the space where the portion of the non-doped silicon layers 73 is removed forms the insulating films 19. Then, a boron-doped polysilicon film 76 is formed on the silicon oxide film 26; and an inter-layer insulating film 77 made of, for example, silicon oxide is formed thereon.

Figures 14A, 14B:
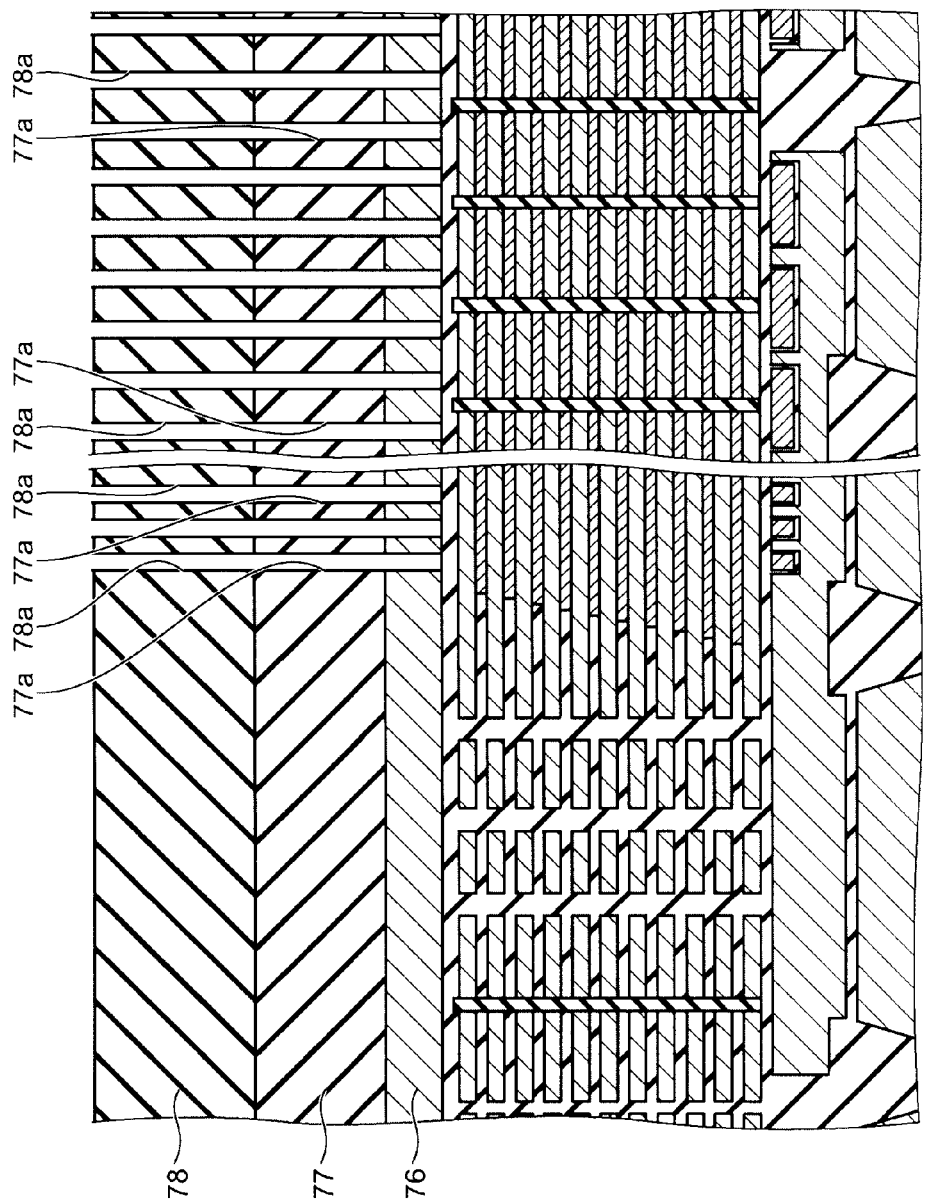
FIGS. 14A to 14B are cross-sectional views of processes, illustrating the method for manufacturing the semiconductor memory device according to the embodiment.

Continuing as illustrated in FIGS. 14A and 14B, a mask film 78 is formed on the inter-layer insulating film 77. Then, the mask film 78 and the inter-layer insulating film 77 are patterned using photolithography and etching; and through-holes 78a and 77a are made in the regions where the memory holes MH (referring to FIGS. 1A and 1B) are to be made.

Figures 15A, 15B:
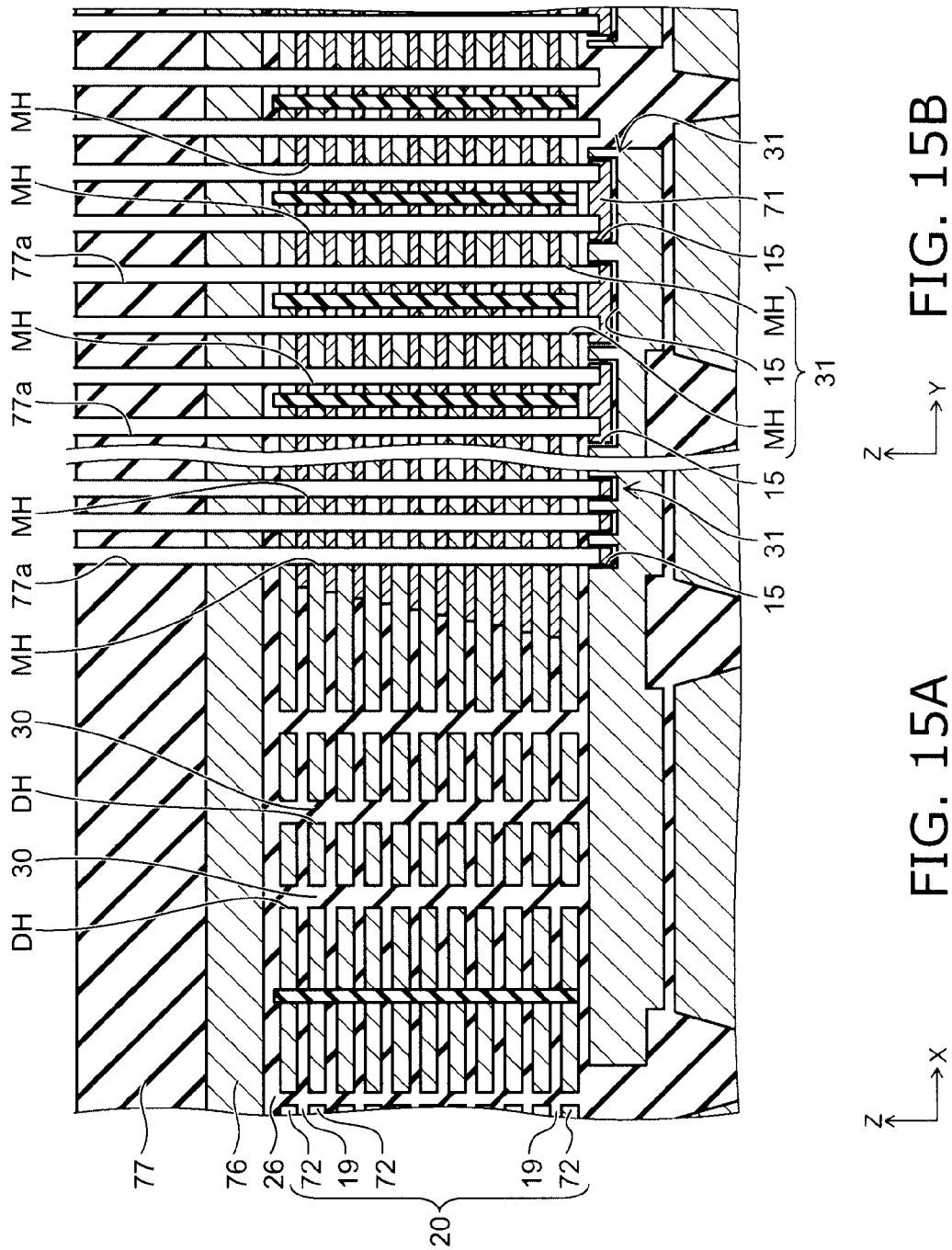
FIGS. 15A to 15B are cross-sectional views of processes, illustrating the method for manufacturing the semiconductor memory device according to the embodiment.

Then, as illustrated in FIGS. 15A and 15B, RIE is performed using the mask film 78 (referring to FIGS. 14A and 14B) as a mask to make the multiple memory holes MH extending in the Z direction to pierce the boron-doped polysilicon film 76, the silicon oxide film 26, and the stacked body 20. The memory holes MH are arranged in a matrix configuration along the X direction and the Y direction; and a pair of the memory holes MH adjacent to each other in the Y direction is made to reach the two Y-direction end portions of the recess 15. Thereby, the pair of memory holes MH at the two ends of one recess 15 communicates to form the U-shaped hole 31. However, at this point in time, the non-doped silicon member 71 is filled into the recess 15. Subsequently, the mask film 78 is removed.

Figures 16A, 16B:
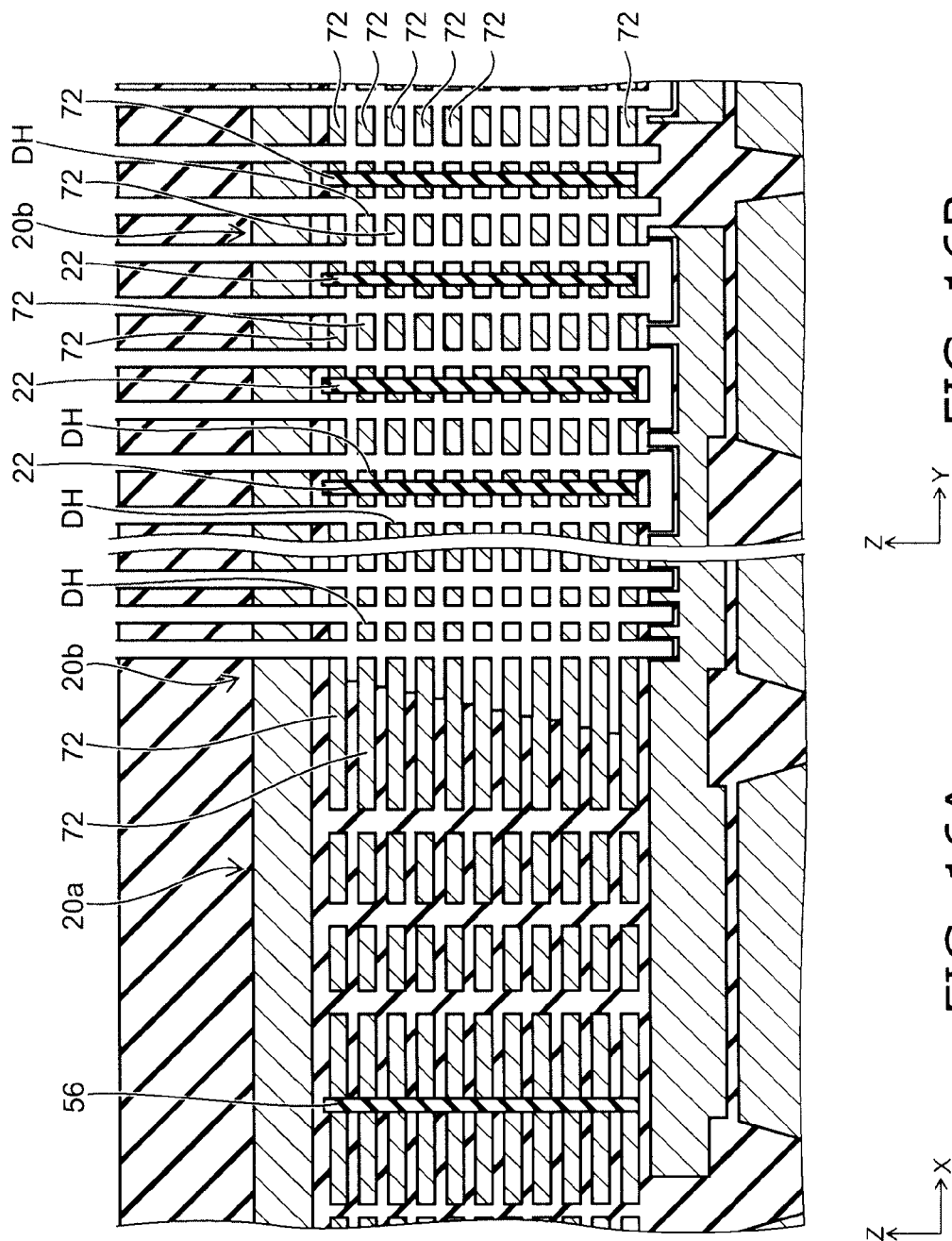
FIGS. 16A to 16B are cross-sectional views of processes, illustrating the method for manufacturing the semiconductor memory device according to the embodiment.

Continuing as illustrated in FIGS. 16A and 16B, wet etching is performed via the memory holes MH. Such wet etching is performed using, for example, an alkaline etchant. Thereby, the non-doped silicon member 71 (referring to FIG. 15B) in the recess 15 is removed and a portion of the non-doped silicon layers 73 (referring to FIG. 15B) is removed. The etching of the non-doped silicon layers 73 starts with the memory holes MH as starting points and removes the portion of the non-doped silicon layers 73 disposed in the cell portion 20b of the stacked body 20. At this time, the boron-doped silicon layers 72 of the cell portion 20b are supported by the columnar members 22 and 56.

Figures 17A, 17B:
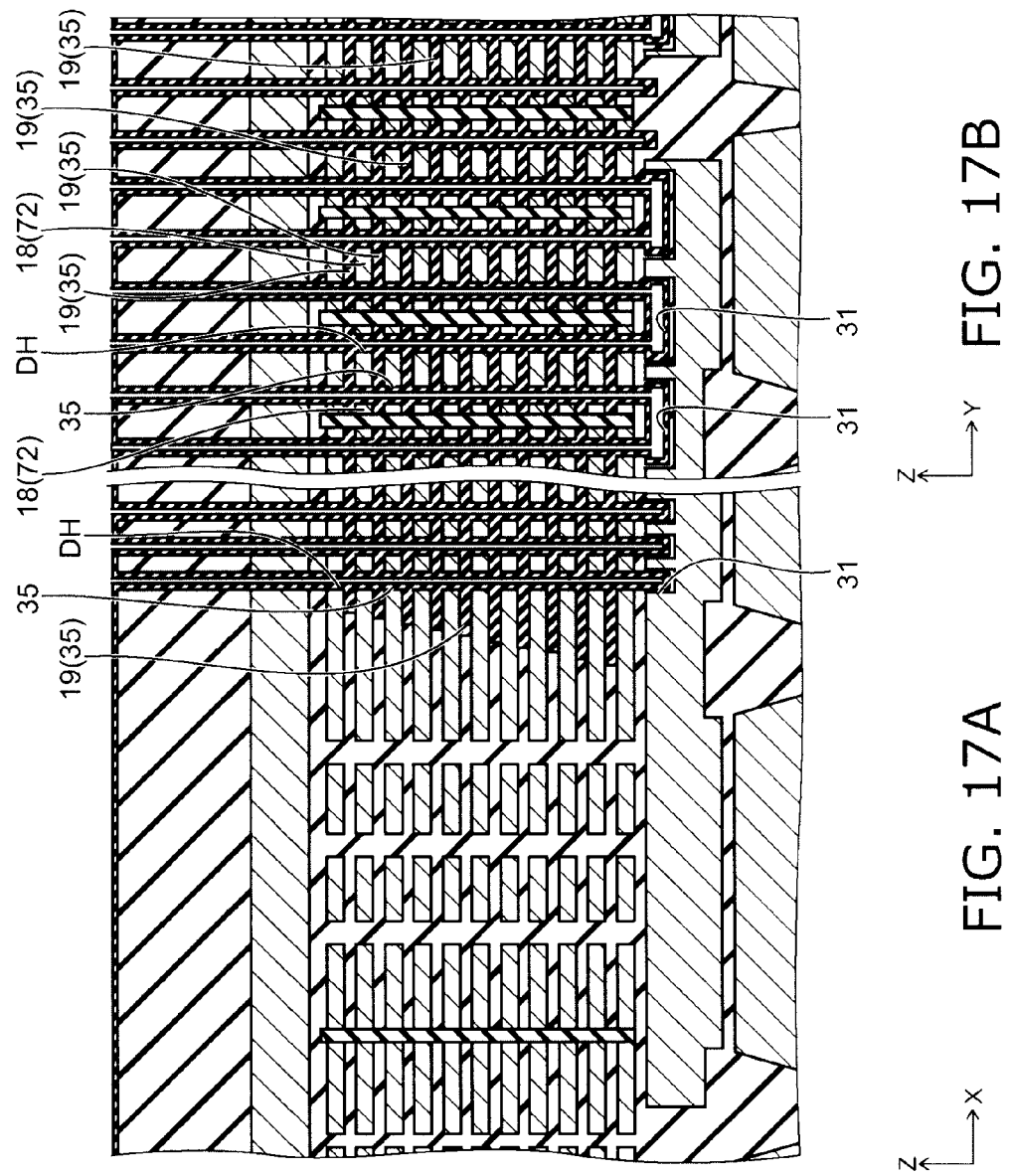
FIGS. 17A to 17B are cross-sectional views of processes, illustrating the method for manufacturing the semiconductor memory device according to the embodiment.

Then, as illustrated in FIGS. 17A and 17B and FIG. 5, silicon oxide is deposited using, for example, ALD (atomic layer deposition). The silicon oxide enters into the U-shaped hole 31 to form the blocking insulating layer 35 on the inner face of the U-shaped hole 31. At this time, the silicon oxide enters via the memory holes MH into the space where the non-doped silicon layers 73 are removed and is deposited on the upper faces and the lower faces of the boron-doped silicon layers 72. The silicon oxide deposited on the upper faces and the lower faces of the boron-doped silicon layers 72 is filled between the boron-doped silicon layers 72 to form the insulating films 19. The remaining boron-doped silicon layers 72 that are not etched form the electrode films 18.

Figures 18A, 18B:
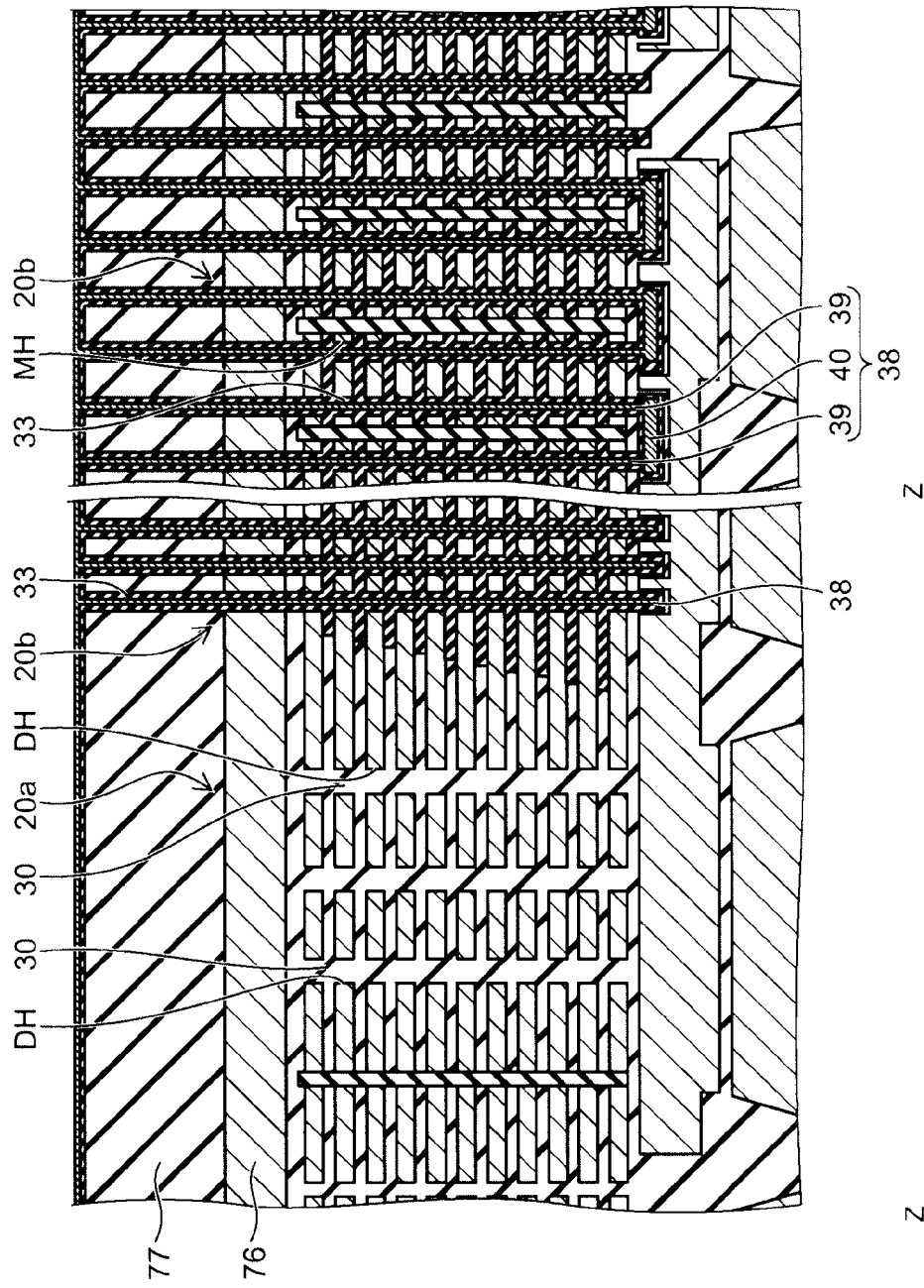
FIGS. 18A to 18B are cross-sectional views of processes, illustrating the method for manufacturing the semiconductor memory device according to the embodiment.

Continuing as illustrated in FIGS. 18A and 18B and FIG. 5, silicon nitride is deposited on the entire surface. Thereby, the charge storage layer 36 is formed on the blocking insulating layer 35. At this time, the charge storage layer 36 does not enter into the space between the electrode films 18 and is formed only in the U-shaped hole 31 because the space between the electrode films 18 is filled with the blocking insulating layer 35. Also, the silicon nitride does not enter into the dummy holes DH made in the end portion 20a and accordingly the charge storage layer 36 is not formed in the dummy holes DH because the silicon oxide 30 is already filled into the dummy holes DH and covered with the boron-doped polysilicon film 76 and the inter-layer insulating film 77. Then, silicon oxide is deposited on the entire surface. Thereby, the tunneling insulating layer 37 is formed on the charge storage layer 36. The memory film 33 is formed of the blocking insulating layer 35, the charge storage layer 36, and the tunneling insulating layer 37.

Then, polysilicon containing an impurity, e.g., phosphorus, is filled into the U-shaped hole 31. Thereby, the U-shaped pillar 38 is formed in the U-shaped hole 31. The portions of the U-shaped pillar 38 disposed in the memory holes MH form the silicon pillars 39 extending in the Z direction; and the portion disposed in the recess 15 forms the connection member 40 extending in the Y direction. Subsequently, etching of the entire surface is performed to remove the polysilicon and the memory film 33 deposited on the inter-layer insulating film 77 and to expose the upper face of the inter-layer insulating film 77.

Figures 19A, 19B:
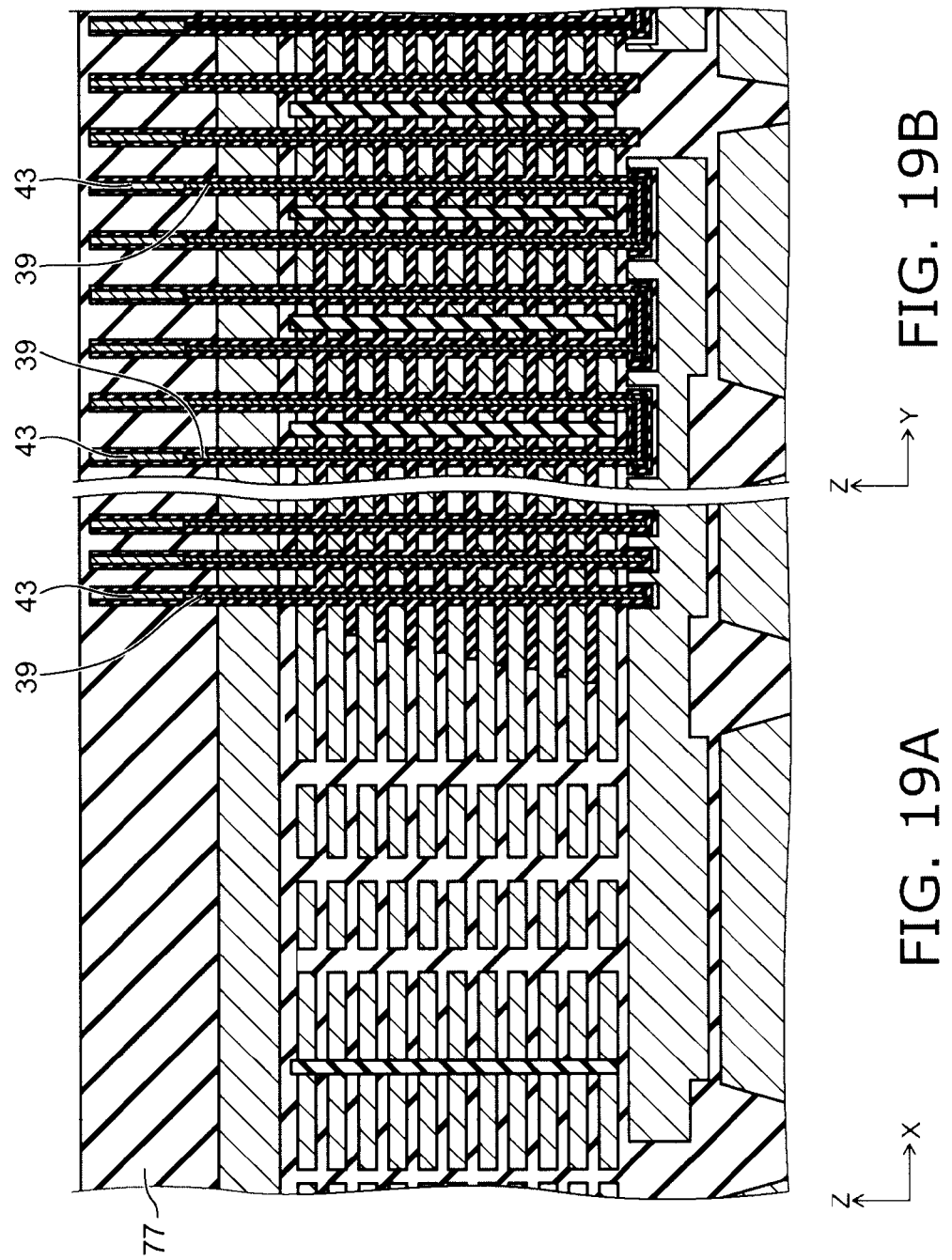
FIGS. 19A to 19B are cross-sectional views of processes, illustrating the method for manufacturing the semiconductor memory device according to the embodiment.

Continuing as illustrated in FIGS. 19A and 19B, an impurity is ion-implanted into the upper portion of the silicon pillar 39. Thereby, the upper portion of the portion of the silicon pillar 39 buried in the inter-layer insulating film 77 forms the plug 43.

Then, as illustrated in FIGS. 20A and 20B, a resist film (not illustrated) is formed on the inter-layer insulating film 77 in the region directly on the cell portion 20b of the stacked body 20. Then, etching is performed using the resist film as a mask to remove the inter-layer insulating film 77, the boron-doped polysilicon film 76, and the silicon oxide film 26 from the region directly on the end portion 20a of the stacked body 20. Subsequently, the resist film is removed.

Continuing as illustrated in FIGS. 21A and 21B, resist films 81 and 82 (referring to FIGS. 26A and 26B) are formed on the stacked body 20; slimming of the resist film and etching using the resist film as a mask are performed alternately; and the end portion 20a of the stacked body 20 is patterned into a chessboard-like stairstep configuration. At this time, as illustrated in FIGS. 26A and 26B, the patterning of the end portion 20a is divided into two patternings. Only the external form of the end portion 20a is illustrated in FIGS. 26A and 26B.

First, as illustrated in FIG. 26A, the resist film 81 is formed on the stacked body 20 and the first patterning is performed. In the slimming process of the first patterning, ashing of the resist film 81 is performed to reduce the volume such that the end edge of the resist film 81 of the region directly on the end portion 20a moves in the Y direction. Then, in the etching process, the resist film 81 is used as a mask to remove one layer of each of the electrode film 18 and the insulating film 19 per one etching process. Thereby, the end portion 20a is patterned such that the electrode film 18 increases or decreases one layer at a time along the Y direction. The slimming process and the etching process are repeated, for example, four times.

Then, as illustrated in FIG. 26B, the resist film 82 is formed on the stacked body 20 and the second patterning is performed. In the slimming process of the second patterning, ashing of the resist film 82 is performed to reduce the volume such that the end edge of the resist film 82 of the region directly on the end portion 20a moves in the X direction. Then, in the etching process, the resist film 82 is used as a mask to remove, for example, five layers of the electrode film 18 and the insulating film 19 per one etching process. Thereby, the end portion 20a is patterned such that the electrode film 18 increases or decreases five layers at a time along the X direction.

Thus, a stairstep having a chessboard-like configuration is formed in the end portion 20a. At this time, the columnar member 21 and the silicon oxide 30 filled into the removed portion of the stacked body 20 also are removed together with the insulating films 19. The portion of the columnar member 56 having the frame-like configuration (referring to FIG. 20A) extending in the Y direction also is removed together with the insulating films 19.

Figures 22A, 22B:
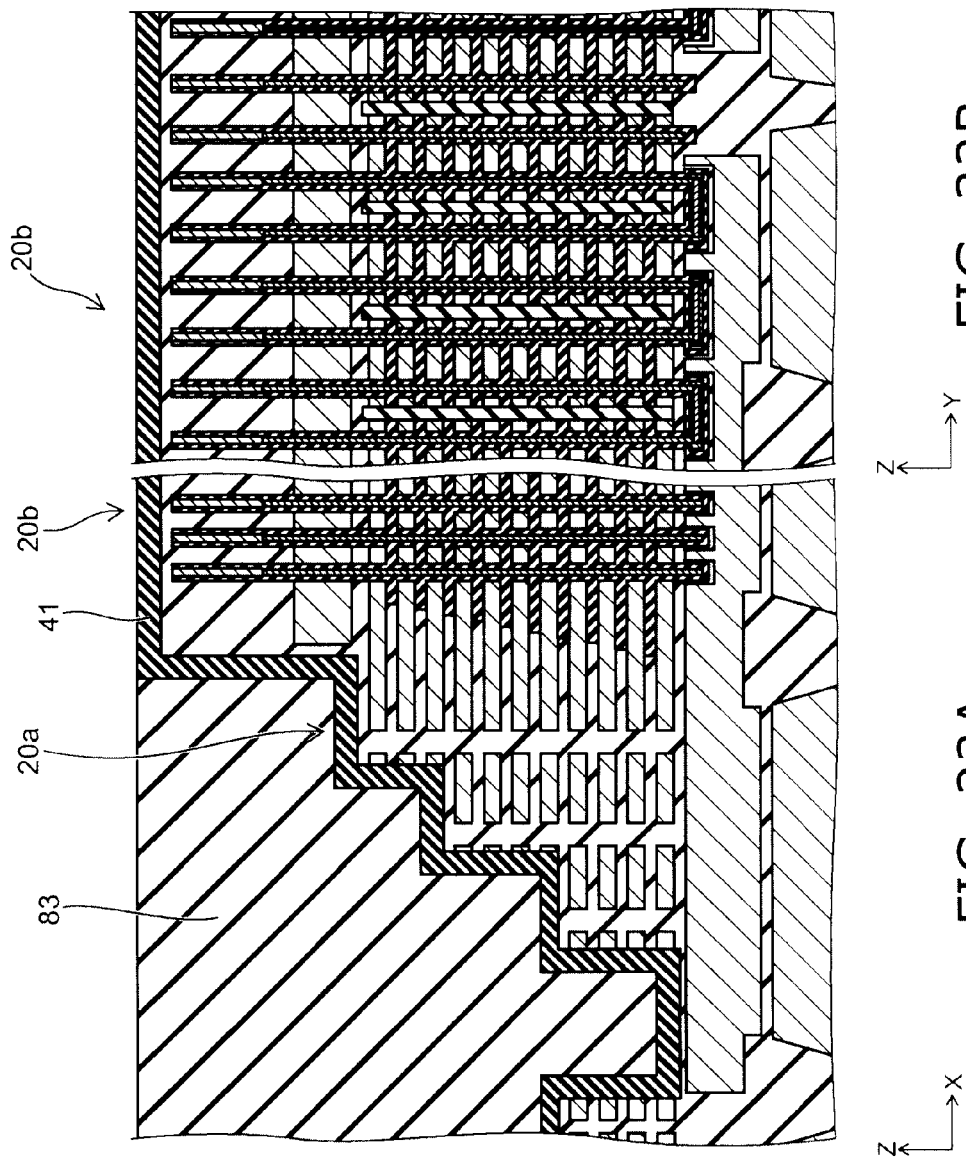
FIGS. 22A to 22B are cross-sectional views of processes, illustrating the method for manufacturing the semiconductor memory device according to the embodiment.

Then, as illustrated in FIGS. 22A and 22B, the silicon nitride film 41 is formed on the entire surface; and an inter-layer insulating film 83 is formed thereon. Then, CMP (Chemical Mechanical Polishing) is performed to expose the silicon nitride film 41 using the silicon nitride film 41 as a stopper. Thereby, the inter-layer insulating film 83 buries the end portion 20a of the stacked body 20.

Figures 23A, 23B:
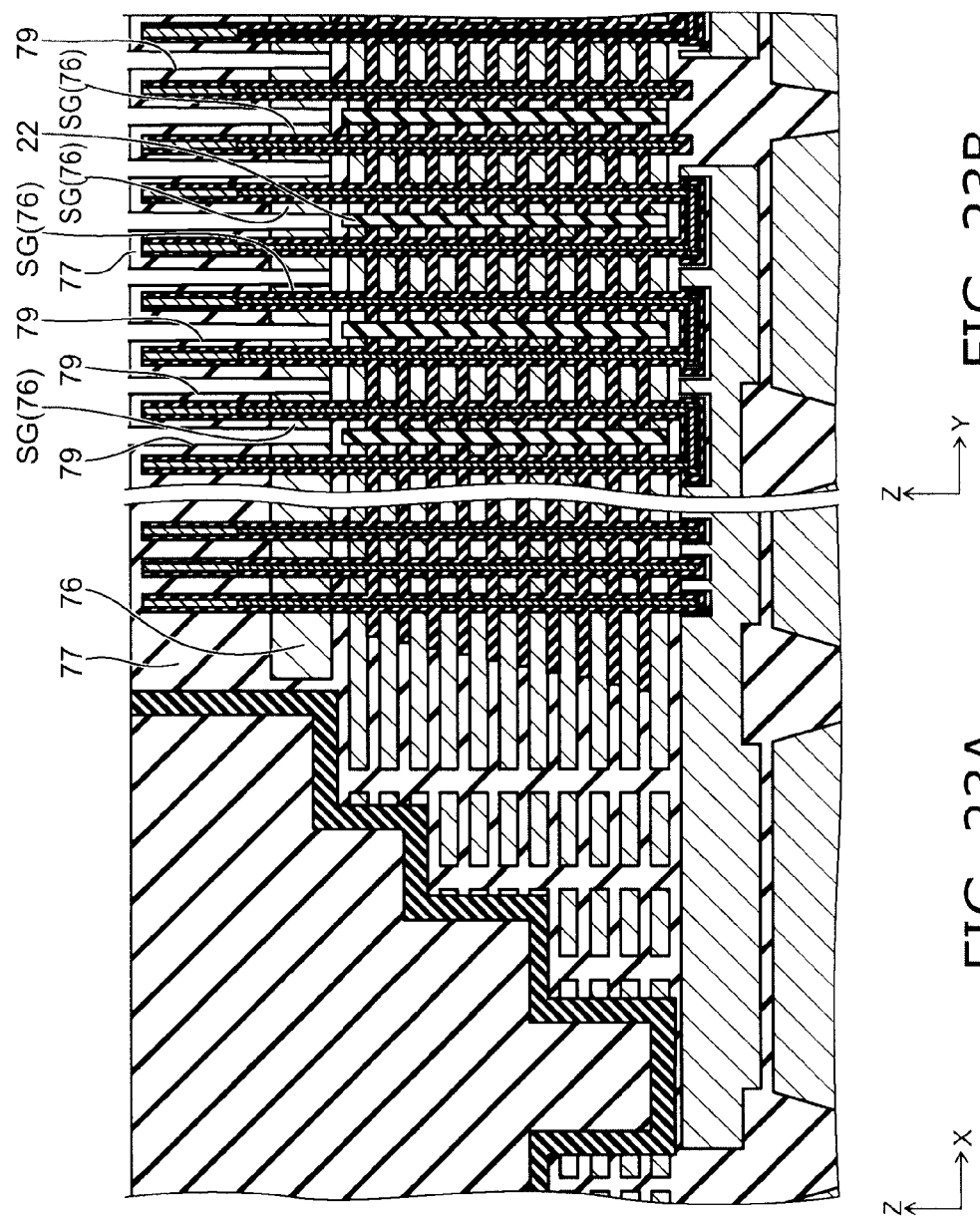
FIGS. 23A to 23B are cross-sectional views of processes, illustrating the method for manufacturing the semiconductor memory device according to the embodiment.

Continuing as illustrated in FIGS. 23A and 23B, ashing is performed to remove the silicon nitride film 41 from the upper face of the stacked body 20. Then, photolithography and etching are performed to make multiple slits 79 extending in the X direction in the interior of the portions of the inter-layer insulating film 77 and the boron-doped polysilicon film 76 in the region directly on the cell portion 20b. At this time, the slits 79 are made between the columns of multiple memory holes MH arranged in the X direction. The slits 79 are disposed in the region directly on every other columnar member 22. Thereby, the boron-doped polysilicon film 76 is divided every column of the multiple memory holes MH arranged in the X direction to form the multiple selection gates SG extending in the X direction.

Figures 24A, 24B:
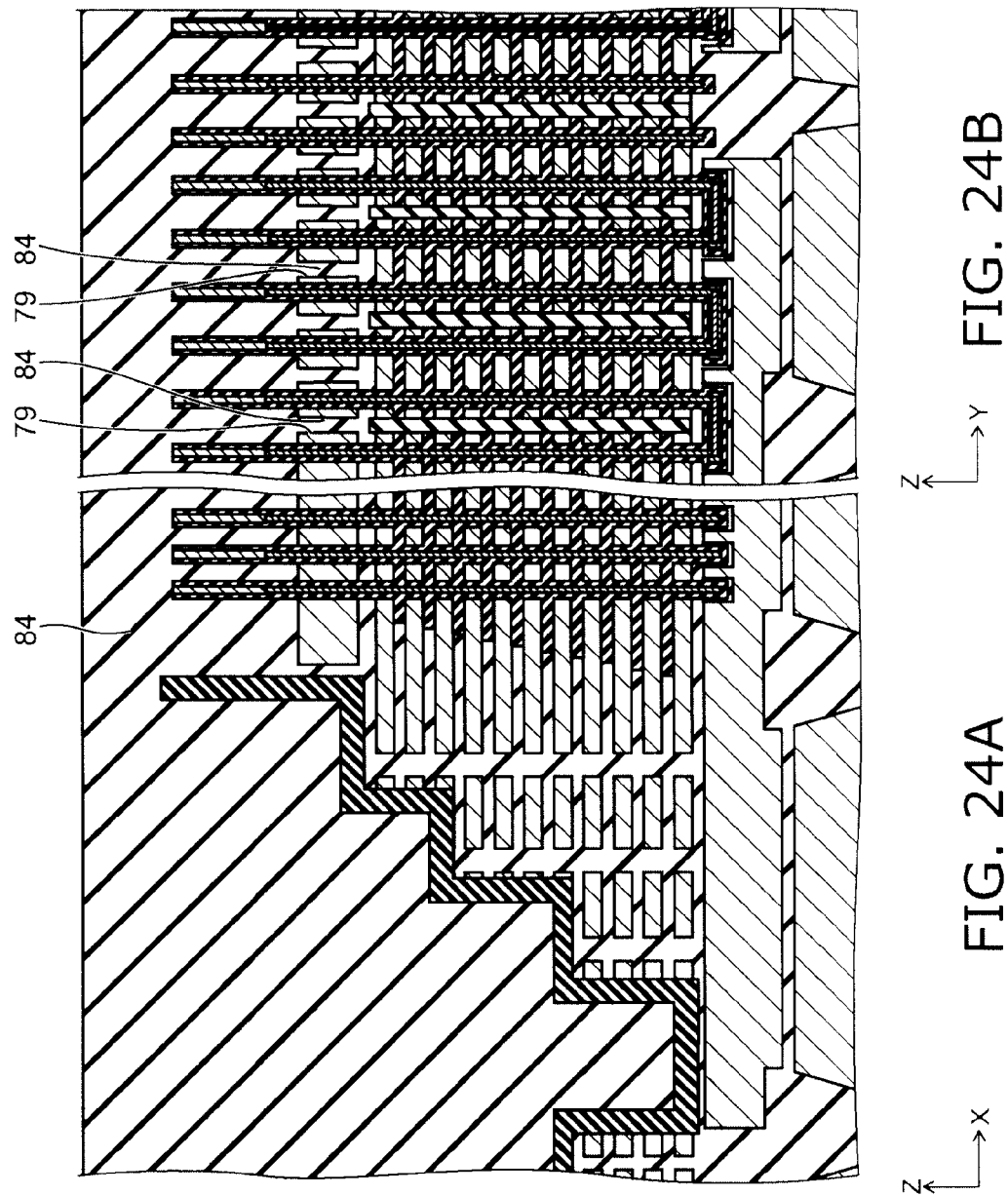
FIGS. 24A to 24B are cross-sectional views of processes, illustrating the method for manufacturing the semiconductor memory device according to the embodiment.

Then, as illustrated in FIGS. 24A and 24B, silicon oxide 84 is deposited on the entire surface. At this time, the silicon oxide 84 is filled also into the slits 79.

Figures 25A, 25B:
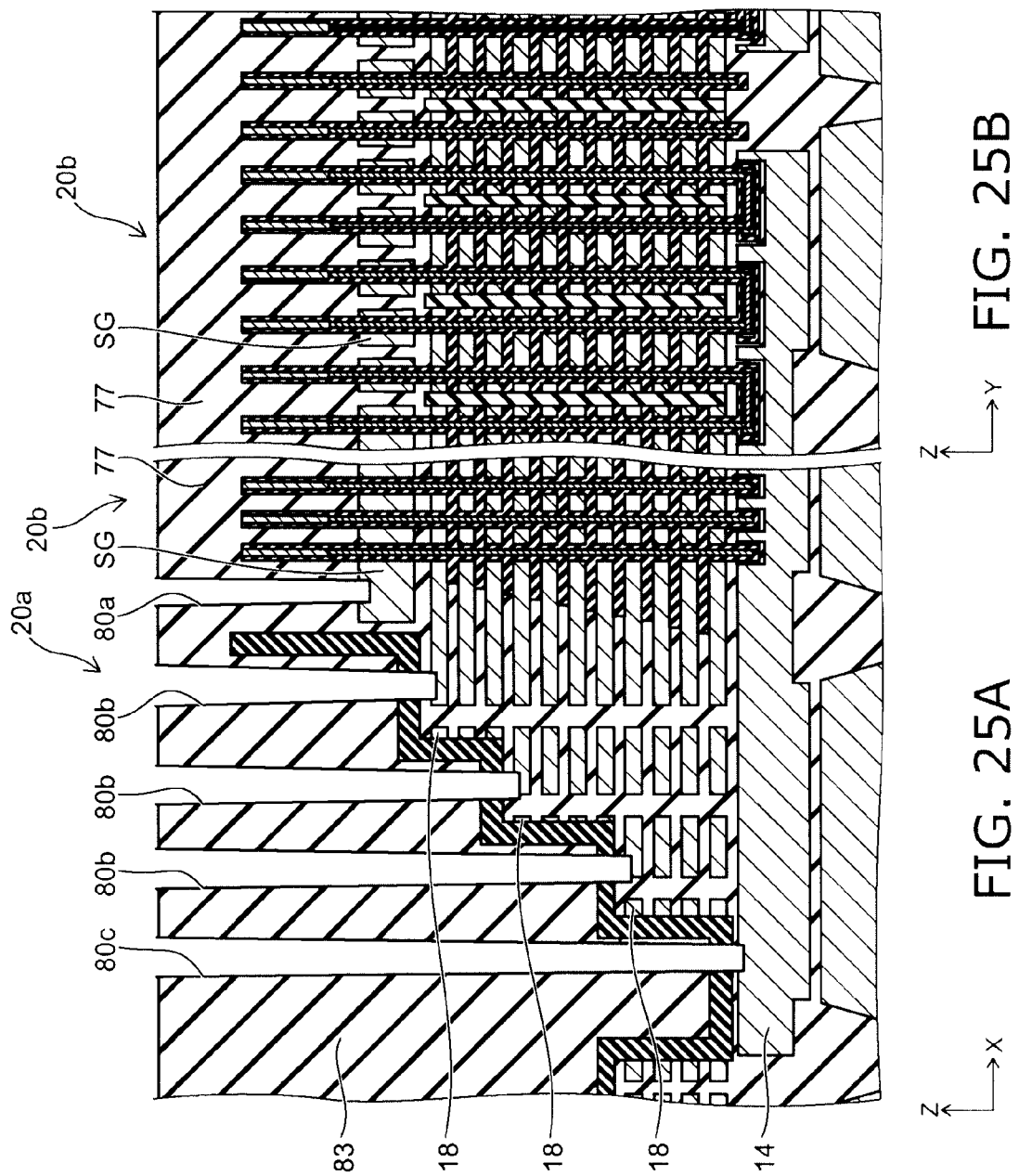
FIGS. 25A to 25B are cross-sectional views of processes, illustrating the method for manufacturing the semiconductor memory device according to the embodiment.

Continuing as illustrated in FIGS. 25A and 25B, a contact hole 80a is made in the inter-layer insulating film 77 in the region directly on the end portion 20a to reach the selection gate SG. At this time, the contact holes 80b and 80c also are made simultaneously in the inter-layer insulating film 83 using the silicon nitride film 41 as a stopper. The contact hole 80b is made to reach each level of the electrode films 18; and the contact hole 80c is made to reach the back gate electrode 14.

Then, as illustrated in FIGS. 1A and 1B, a conductive material such as, for example, tungsten is filled into the contact holes 80a, 80b, and 80c (referring to FIGS. 25A and 25B) to form the contacts 44, 45, and 46, respectively; and normal methods are used to form the source line 47, the plug 48, the interconnects 49 and 50, the plug 53, the bit line 51, and the interconnect 52. Subsequently, the silicon nitride film 54 and the inter-layer insulating film 55 are formed; and the pre-scribed interconnects and the like are formed. Thus, the semiconductor memory device 1 according to this embodiment is manufactured. The inter-layer insulating films 77 and 83, the silicon oxide 84, and the like described above form the inter-layer insulating film 42 in the completed device 1.

Operational effects of this embodiment will now be described.

In this embodiment, the stacked body 20 is formed on the silicon substrate 11 by alternately stacking the boron-doped silicon layers 72 and the non-doped silicon layers 73 (referring to FIGS. 6A and 6B); and subsequently, the memory holes MH are made in the cell portion 20b of the stacked body 20 (referring to FIGS. 15A and 15B). Thus, when making the memory holes MH in the stacked body 20, the stacked body 20 is formed of only the boron-doped silicon layers 72 and the non-doped silicon layers 73; and films that are difficult to etch such as silicon oxide films do not exist. Therefore, a substantially perpendicular inner face of the memory hole MH can be formed; and the lower portion of the memory hole MH is not narrower than the upper portion. Thereby, the device 1 can be downsized because it is unnecessary to make the memory hole MH with a large diameter at the upper portion to anticipate narrowing downward. Further, the characteristics of the memory cell transistors can be uniform and the reliability can be higher because the diameter of the memory hole MH is substantially equal between the memory cell transistors formed at the upper portion of the stacked body 20 and the memory cell transistors formed at the lower portion.

In the process illustrated in FIGS. 13A and 13B of this embodiment, the non-doped silicon layer 73 is removed from the end portion 20a of the stacked body 20; and the silicon oxide 30 is filled. Therefore, in the process of making the contact holes illustrated in FIGS. 25A and 25B, the insulating films 19 made of silicon oxide are provided between the electrode films 18 made of boron-doped silicon. Therefore, it is easy to stop the etching at the electrode films 18 by etching with conditions matched to silicon oxide. Supposing that the contact holes were made in a state in which the non-doped silicon layer 73 and the boron-doped silicon layer 72 are stacked in the end portion 20a, it would be difficult to control the ends of the contact holes; and the reliability of the device 1 would decrease. In this embodiment, by making the dummy holes DH in the end portion 20a of the stacked body 20, the removal of the non-doped silicon layers 73 and the filling of the silicon oxide 30 described above is easy.

Further, in this embodiment, the dummy holes DH and the memory holes MH are made in separate processes (referring to FIGS. 11A and 11B and FIGS. 15A and 15B). Then, the silicon oxide 30 is filled into the dummy holes DH (referring to FIGS. 13A and 13B); and the blocking insulating layer 35, the charge storage layer 36, the tunneling insulating layer 37, and the silicon pillar 39 are filled into the memory holes MH (referring to FIGS. 17A and 17B and FIGS. 18A and 18B). Therefore, the charge storage layer 36 is not formed in the dummy holes DH.

As described above, although it is necessary to form the charge storage layer 36 of a material capable of storing charge, it is necessary to form the charge storage layer 36 of a material different from those of the electrode film 18 and the insulating film 19 because it is undesirable to store charge in the electrode film 18 and the insulating film 19. Accordingly, supposing that the charge storage layer 36 is formed in the dummy holes DH, the charge storage layer 36 formed in the dummy holes DH would not be etchable by the etching conditions for etching the electrode film 18 or by the etching conditions for etching the insulating film 19 in the process of patterning the end portion 20a into the stairstep configuration illustrated in FIGS. 21A and 21B; and the charge storage layer 36 would undesirably remain on the end portion 20a. Then, the remaining charge storage layer 36 would become dust and undesirably reduce the reliability of the device 1. For example, the dust originating from the charge storage layer 36 would form a mask in subsequent etching and would undesirably reduce the patterning precision of etching.

Conversely, in this embodiment, dust originating from the charge storage layer 36 does not occur because the charge storage layer 36 is not formed in the dummy holes DH. Although the silicon oxide 30 is filled into the dummy holes DH, the silicon oxide 30 does not easily become dust because the silicon oxide 30 is etched with the insulating film 19 which is made of the same silicon oxide when etching the insulating film 19. As a result, a semiconductor memory device 1 having high reliability can be manufactured.

In this embodiment, as illustrated in FIGS. 26A and 26B, the end portion 20a of the stacked body 20 is patterned into a stairstep having a chessboard-like configuration. Thereby, the number of steps can be increased while suppressing the film thickness of the resist film used to pattern the end portion 20a. By forming the stairstep in a chessboard-like configuration and connecting one contact to each of the steps, the contacts are arranged in a matrix configuration as viewed from the Z direction. In this embodiment, the columnar member 21 is formed at the center of the rectangle formed by four contacts. Thereby, the reliability is guaranteed by having the shortest distance between the contacts and the columnar member 21 not less than a constant value; the arrangement density of the contacts and the columnar members 21 can be increased; and higher integration of the device 1 can be realized.

Moreover, in this embodiment, the dummy holes DH are disposed on two sides of the columnar member 21. Thereby, in the process illustrated in FIGS. 12A and 12B, a wide portion of the non-doped silicon layers 73 can be removed by wet etching without being impeded by the columnar member 21. Also, the distance between the dummy holes DH and the contacts can be increased by disposing the dummy holes DH proximally to the columnar member 21. Thereby, the shortest distance between the dummy holes DH and the contacts is ensured to be not less than a constant value; and higher integration of the device 1 can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

According to the embodiments described above, a semiconductor memory device having high reliability and a method for manufacturing the same can be realized.

The invention claimed is:
1. A semiconductor memory device, comprising:
  a stacked body including an electrode film stacked alternately with an insulating film, a configuration of an end portion of the stacked body being a stairstep configuration having a step provided every electrode film;
  a contact connected to the electrode film from above the end portion;
  a semiconductor member provided in a portion of the stacked body other than the end portion to pierce the stacked body in a stacking direction;
  a charge storage layer provided between the electrode film and the semiconductor member;
  a penetration member piercing the end portion in the stacking direction,
  a columnar member piercing the stacked body in the stacking direction,
  a plurality of said contacts being arranged in a matrix configuration as viewed from the stacking direction; and
  the columnar member being disposed to include a center of a rectangle formed by four of the contacts.

2. The device according to claim 1, wherein a pair of the penetration members are disposed on two sides of the columnar member as viewed from the stacking direction.

3. The device according to claim 1, wherein the penetration member includes the same kind of material as the insulating film.

4. The device according to claim 1, wherein the charge storage layer is made of silicon nitride.

5. The device according to claim 1, wherein the penetration member does not include the same kind of material as the charge storage layer.

6. The device according to claim 1, wherein the columnar member is rectangular in a cross section vertical to the stacking direction.

7. The device according to claim 6, wherein the penetration member is provided at an edge of the step.

8. The device according to claim 1, wherein the penetration member is provided at an edge of the step.

9. A semiconductor memory device, comprising:
   a stacked body including an electrode film stacked alternately with an insulating film, a configuration of an end portion of the stacked body being a stairstep configuration having a step provided every electrode film;
   a plurality of contacts connected to the electrode films respectively from above the end portion;
   a columnar member piercing the stacked body in a stacking direction;
   a semiconductor member provided in a portion of the stacked body other than the end portion to pierce the stacked body in a stacking direction; and
   a charge storage layer provided between the electrode film and the semiconductor member,
   the plurality of contacts being arranged in a matrix configuration as viewed from the stacking direction,
   the columnar member being disposed to include a center of a rectangle formed by four of the contacts.

10. The device according to claim 9, further comprising a penetration member piercing the stacked body,
    the penetration member not including the same kind of material as the charge storage layer.

11. The device according to claim 10, wherein the charge storage layer is made of silicon nitride.

12. The device according to claim 10, wherein the penetration member includes the same kind of material as the insulating film.

13. The device according to claim 12, wherein the insulating film is made of silicon oxide.

14. The device according to claim 10, wherein a pair of the penetration members are disposed on two sides of the columnar member as viewed from the stacking direction.

15. The device according to claim 9, wherein the columnar member is rectangular in a cross section vertical to the stacking direction.

* * * * *